US011005061B2

(12) United States Patent
Song et al.

(10) Patent No.: US 11,005,061 B2
(45) Date of Patent: May 11, 2021

(54) ORGANIC LIGHT EMITTING DISPLAY DEVICE

(71) Applicant: LG DISPLAY CO., LTD., Seoul (KR)

(72) Inventors: Ki-Woog Song, Goyang-si (KR);
Chang-Wook Han, Seoul (KR);
Hong-Seok Choi, Seoul (KR);
Sung-Hoon Pieh, Seoul (KR);
Jeong-Dae Seo, Incheon (KR);
Seok-Joon Oh, Paju-si (KR);
Youn-Seok Kam, Seoul (KR)

(73) Assignee: LG Display Co., Ltd., Seoul (KR)

( * ) Notice: Subject to any disclaimer, the term of this patent is extended or adjusted under 35 U.S.C. 154(b) by 406 days.

(21) Appl. No.: 14/097,675

(22) Filed: Dec. 5, 2013

(65) Prior Publication Data
US 2014/0183475 A1 Jul. 3, 2014

(30) Foreign Application Priority Data

Dec. 31, 2012 (KR) .................. 10-2012-0158195
May 31, 2013 (KR) .................. 10-2013-0062631

(51) Int. Cl.
*H01L 51/50* (2006.01)
*H01L 51/52* (2006.01)
*H01L 27/32* (2006.01)

(52) U.S. Cl.
CPC ...... *H01L 51/5044* (2013.01); *H01L 51/5004* (2013.01); *H01L 51/5278* (2013.01); *H01L 27/3213* (2013.01); *H01L 2251/552* (2013.01)

(58) Field of Classification Search
CPC .......... H01L 2251/552; H01L 27/3213; H01L 51/5004; H01L 51/5044; H01L 51/5278
See application file for complete search history.

(56) References Cited

U.S. PATENT DOCUMENTS 7,994,498 B2 * 8/2011 Pieh ............... H01L 51/5044
257/40
8,350,257 B2 * 1/2013 Pieh ............... H01L 51/5036
257/40

(Continued)

FOREIGN PATENT DOCUMENTS

CN 102113414 A 6/2011
CN 102546840 A 5/2012

(Continued)

OTHER PUBLICATIONS

Office Action dated Jan. 5, 2016 for corresponding Chinese Patent Application No. 201310552954.9, 13 pages.

*Primary Examiner* — Mohammed Shamsuzzaman
(74) *Attorney, Agent, or Firm* — Seed IP Law Group LLP

(57) ABSTRACT

An organic light emitting display device includes a first electrode and a second electrode disposed on a substrate opposite to each other, a first stack including a hole injection layer, a first hole transport layer, a first light emitting layer, and a first electron transport layer sequentially stacked on the first electrode, a second stack including a second hole transport layer, a second light emitting layer, and a second electron transport layer sequentially stacked between the first stack and the second electrode, and a charge generation layer disposed between the first stack and the second stack and including an N-type charge generation layer and a P-type charge generation layer to control charge balance between the first and second stacks. The P-type charge generation layer is doped with 1% to 20% of a hole transport material based on a volume of the P-type charge generation layer.

8 Claims, 28 Drawing Sheets

(56) References Cited

U.S. PATENT DOCUMENTS

| | | | |
|---|---|---|---|
| 8,476,624 B1* | 7/2013 | Wu | H01L 51/5004 257/40 |
| 8,933,438 B2* | 1/2015 | Leem | H01L 51/4273 257/40 |
| 9,159,957 B2* | 10/2015 | Pieh | H01L 51/5278 |
| 9,224,967 B2* | 12/2015 | Yoo | H01L 51/5088 |
| 9,685,624 B2* | 6/2017 | Reusch | H01L 51/5278 |
| 9,997,739 B2* | 6/2018 | Song | H01L 51/5278 |
| 2007/0205411 A1* | 9/2007 | Itai | H01L 51/5278 257/40 |
| 2008/0297036 A1* | 12/2008 | Noh | C09K 11/06 313/504 |
| 2009/0015150 A1* | 1/2009 | Kang et al. | 313/504 |
| 2009/0184313 A1* | 7/2009 | Buesing | C07C 13/72 257/40 |
| 2010/0301317 A1* | 12/2010 | Nowatari | H01L 51/504 257/40 |
| 2011/0127561 A1* | 6/2011 | Ide | H01L 51/5278 257/99 |
| 2011/0215308 A1 | 9/2011 | Im et al. | |
| 2012/0025180 A1* | 2/2012 | Matsumoto | H01L 51/5278 257/40 |
| 2013/0264551 A1* | 10/2013 | Pieh | H01L 51/5056 257/40 |
| 2015/0207091 A1* | 7/2015 | Morimoto | H01L 51/5044 257/40 |

FOREIGN PATENT DOCUMENTS

| | | |
|---|---|---|
| EP | 2 309 824 A1 | 4/2011 |
| KR | 10-2006-0120506 A | 11/2006 |
| KR | 10-2011-0043722 A | 4/2011 |
| KR | 10-2011-0125861 A | 11/2011 |
| KR | 10-2012-0041460 A | 5/2012 |
| KR | 10-2012-0072815 A | 7/2012 |

* cited by examiner

ORGANIC LIGHT EMITTING DISPLAY DEVICE

This application claims the benefit of priority to Korean Patent Applications No. 10-2012-0158195, filed on Dec. 31, 2012 and No. 10-2013-0062631, filed on May 31, 2013, which are hereby incorporated by reference as if fully set forth herein.

BACKGROUND

Field of the Disclosure

The present disclosure relates to an organic light emitting display device, and more particularly, to an organic light emitting display device having reduced driving voltage and increased lifespan by doping a P-type charge generation layer with a hole transport material.

Discussion of the Related Art

There is continuous progress in the development of slim, lightweight, and portable devices with improved performance for an image display device, which displays a variety of information on a screen as a core technology in advanced information and communication. Organic light emitting display devices that display an image by adjusting an amount of light emitted from an organic light emitting layer are recently receiving attention as flat panel display devices having reduced weight and volume, which are drawbacks of cathode ray tubes (CRTs). Organic light emitting display devices are considered most competitive because they do not need a separate light source and realize a compact device design and vivid color reproduction.

In this regard, the organic light emitting device (OLED) that is a self-emissive device fabricated by interposing a thin lighting emitting layer between electrodes may have a paper-like thin layered structure. Particularly, the organic light emitting device includes an anode, a hole injection layer (HIL), a hole transport layer (HTL), a light emitting layer (EML), an electron transport layer (ETL), an electron injection layer (EIL), and a cathode.

As described above, an organic light emitting device used in the organic light emitting display device generally has a single-stack structure. However, applications of a multi-stack structure continue to grow.

The organic light emitting device having a multi-stack structure includes an anode, a cathode, and a first stack, a charge generation layer, and a second stack, which are sequentially stacked between the anode and the cathode.

Here, the first stack includes a hole transport layer, a light emitting layer, and an electron transport layer, which are disposed on the anode, and the second stack includes a hole transport layer, a light emitting layer, and an electron transport layer.

The charge generation layer is disposed between the first and second stacks to control charge balance therebetween and includes an N-type charge generation layer and a P-type charge generation layer.

Here, the P-type charge generation layer generates holes and electrons, injects the electrons into the N-type charge generation layer, and injects the holes into the hole transport layer of the second stack. Currently, the P-type charge generation layer is formed of HAT(CN)6 alone. However, since HAT(CN)6 has inefficient hole generation and hole injection, an organic light emitting device including the same may have increased driving voltage and decreased lifespan.

SUMMARY

An organic light emitting display device includes a first electrode and a second electrode disposed on a substrate opposite to each other, a first stack including a hole injection layer, a first hole transport layer, a first light emitting layer, and a first electron transport layer sequentially stacked on the first electrode, a second stack including a second hole transport layer, a second light emitting layer, and a second electron transport layer sequentially stacked between the first stack and the second electrode, and a charge generation layer disposed between the first stack and the second stack and including an N-type charge generation layer and a P-type charge generation layer to control charge balance between the first and second stacks. The P-type charge generation layer is doped with 1% to 20% of a hole transport material based on a volume of the P-type charge generation layer.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EXEMPLARY EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to FIGS. 1A through 8B.

Figure 1A:
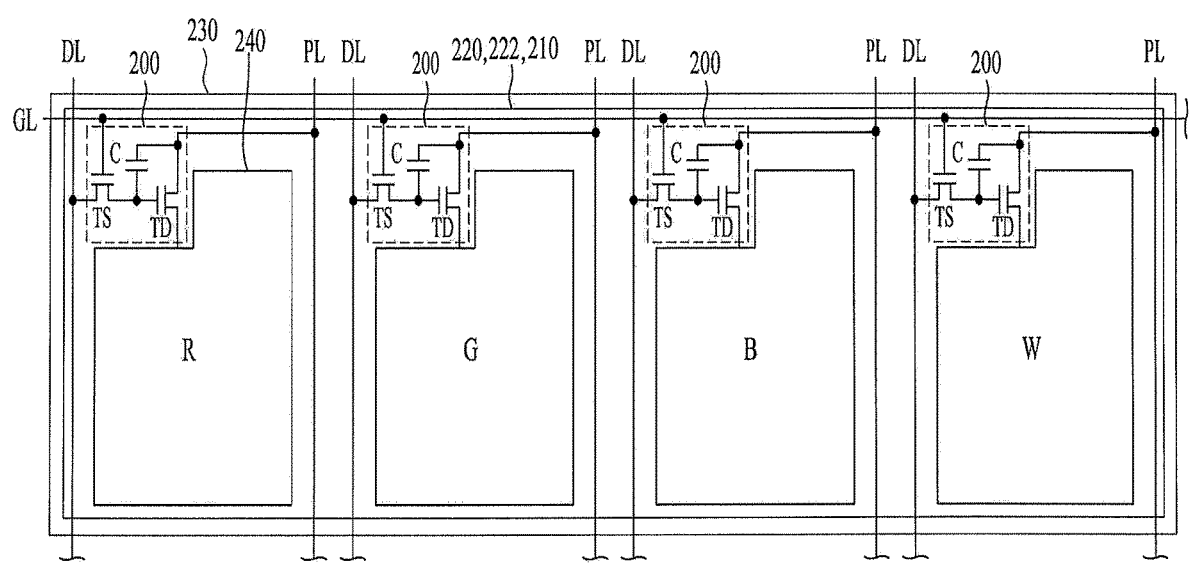
FIGS. 1A to 1D are equivalent circuit diagrams illustrating R, G, B, and W sub-pixels of an organic light emitting display device according to a first embodiment of the present invention.
Figure 1B:
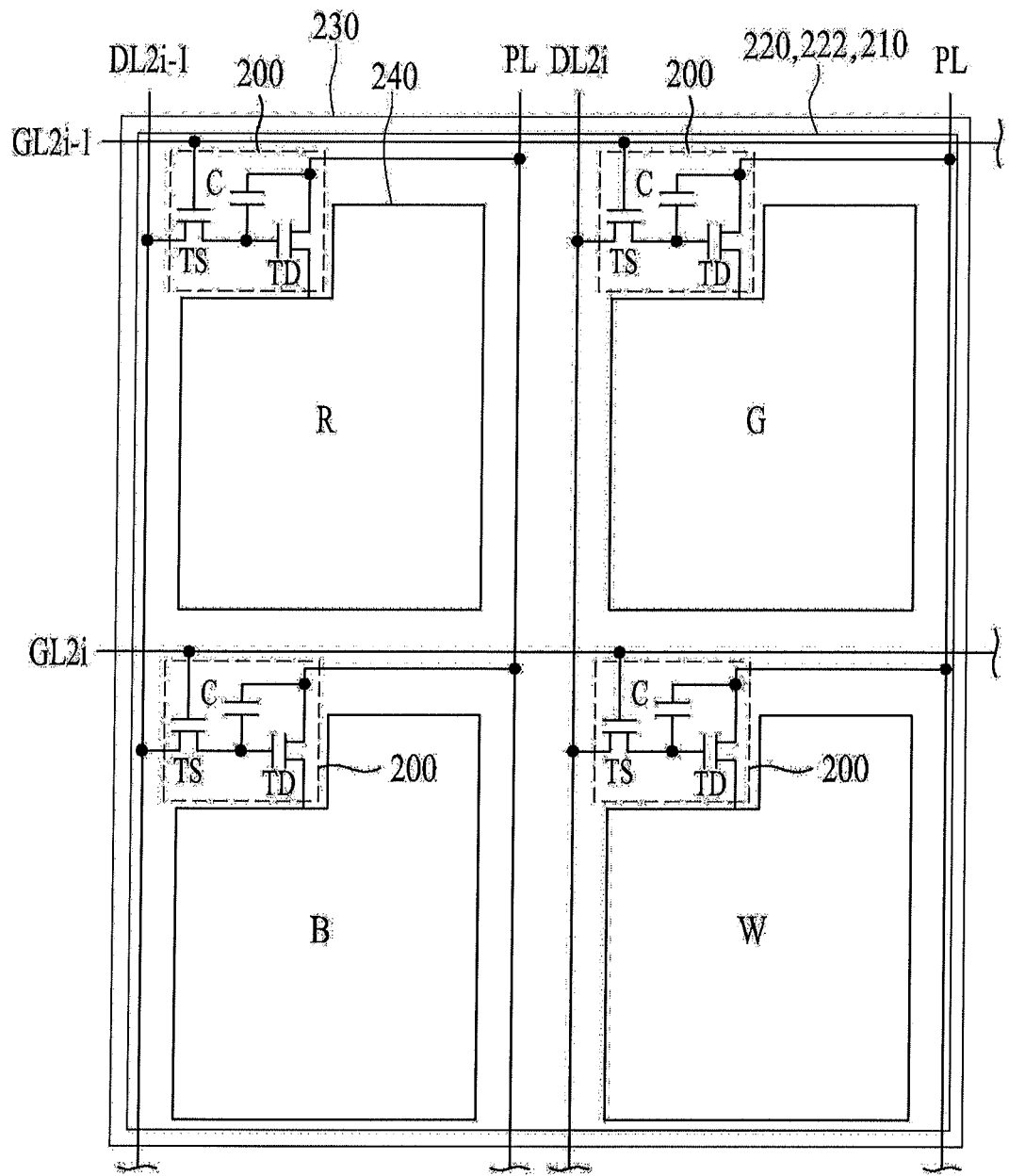
Figure 2:
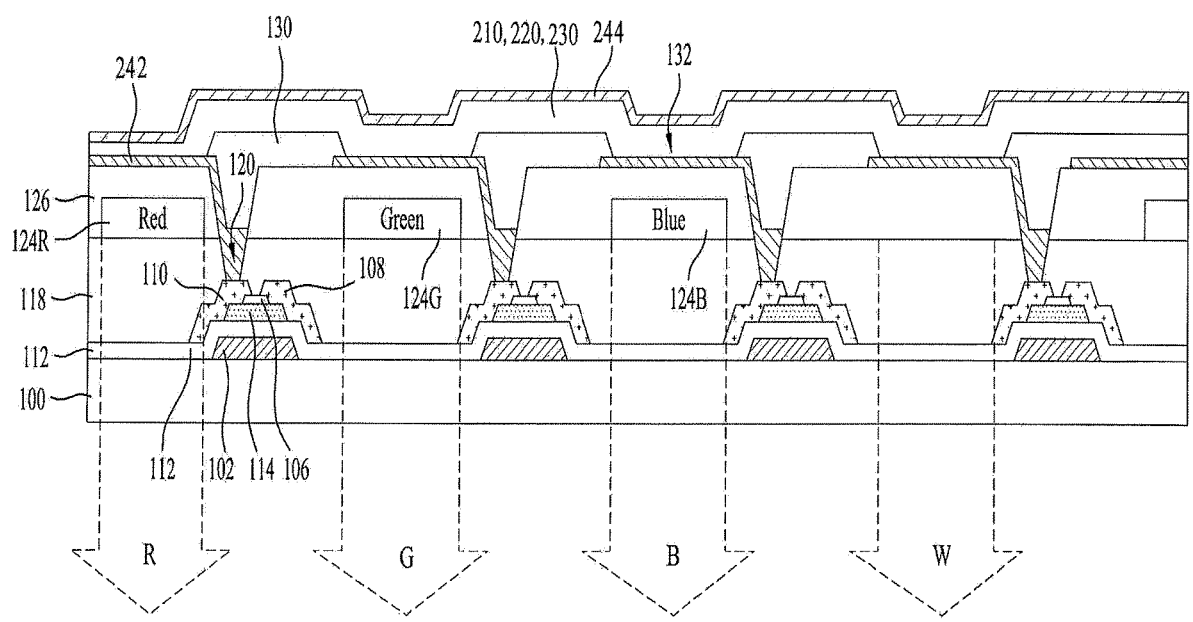
FIG. 2 is a cross-sectional view illustrating R, G, B, and W sub-pixels of the organic light emitting display device illustrated in FIGS. 1A to 1D.
Figure 3:
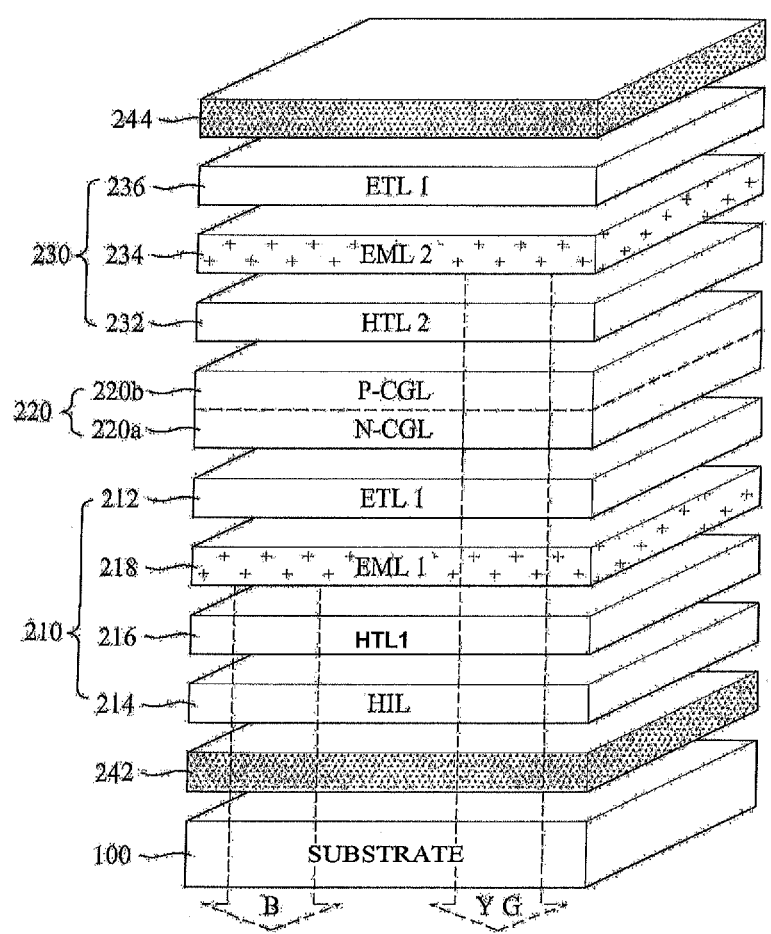
FIG. 3 is a perspective view illustrating the white organic light emitting display device of FIG. 2.
Figure 4:
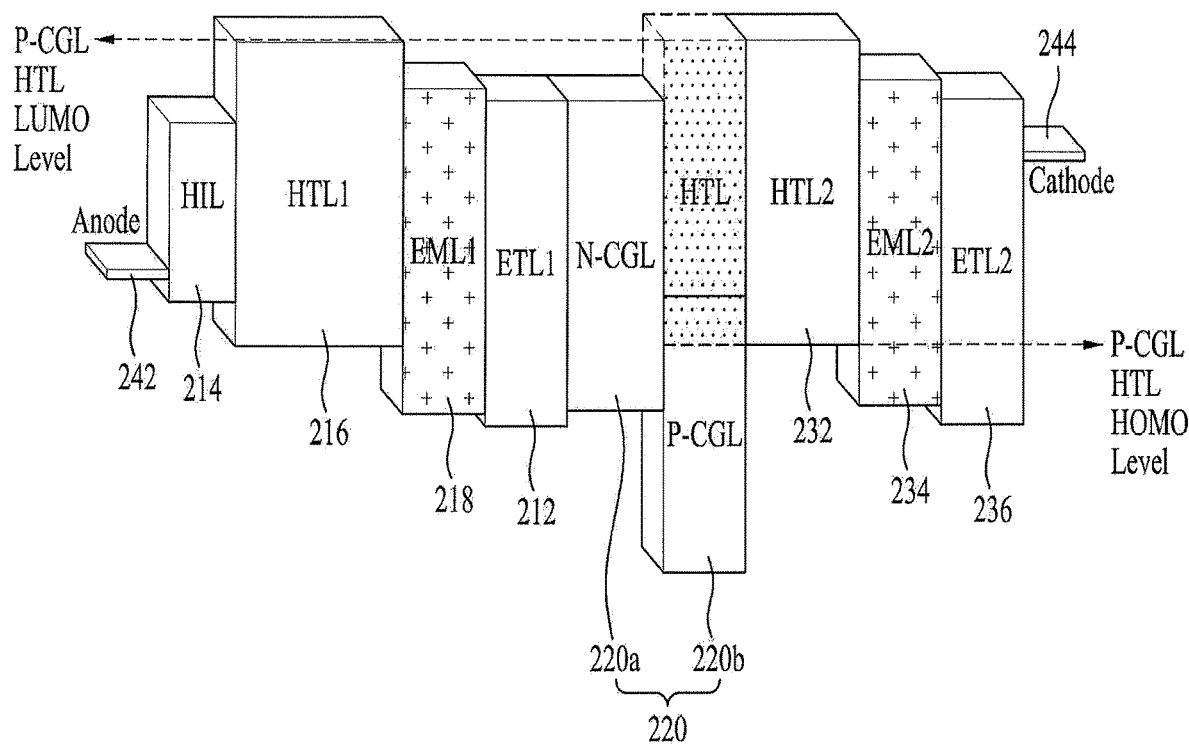
FIG. 4 is a band diagram of the white organic light emitting display device of FIG. 2.

FIGS. 1A to 1D are equivalent circuit diagrams illustrating R, G, B, and W sub-pixels of an organic light emitting display device according to a first embodiment of the present invention. FIG. 2 is a cross-sectional view illustrating R, G, B, and W sub-pixels of the organic light emitting display device illustrated in FIGS. 1A to 1D. FIG. 3 is a perspective view of the white organic light emitting display device of FIG. 2. FIG. 4 is a band diagram of the white organic light emitting display device of FIG. 2.

The organic light emitting display device according to the illustrated embodiment includes a substrate in which a display region is defined with a plurality of sub-pixel regions arranged in a matrix form and a sealing substrate or a thin-film encapsulation substrate for protecting sub-pixels formed on the substrate from moisture or oxygen.

The plurality of sub-pixel regions includes an R sub-pixel region, a G sub-pixel region, a B sub-pixel region, and a W sub-pixel region, and the R, G, B, and W sub-pixel regions are arrayed in a matrix form so as to display an image. The R, G, B, and W sub-pixel region may be arrayed in a matrix with 1 row and 4 columns along the same line as a gate line as illustrated in FIG. 1A or may be arranged in a matrix form with 4 rows and 1 column along the same line as a data line as illustrated in FIG. 1B. Here, the sub-pixel regions are arranged in the order of the R, G, B, and W sub-pixel regions, but may also be arranged in the order of the R, B, G, and W sub-pixel regions and the order of W, R, G, and B sub-pixel regions. The order of arrangement may be changed by a user without limitation.

Figure 1C:
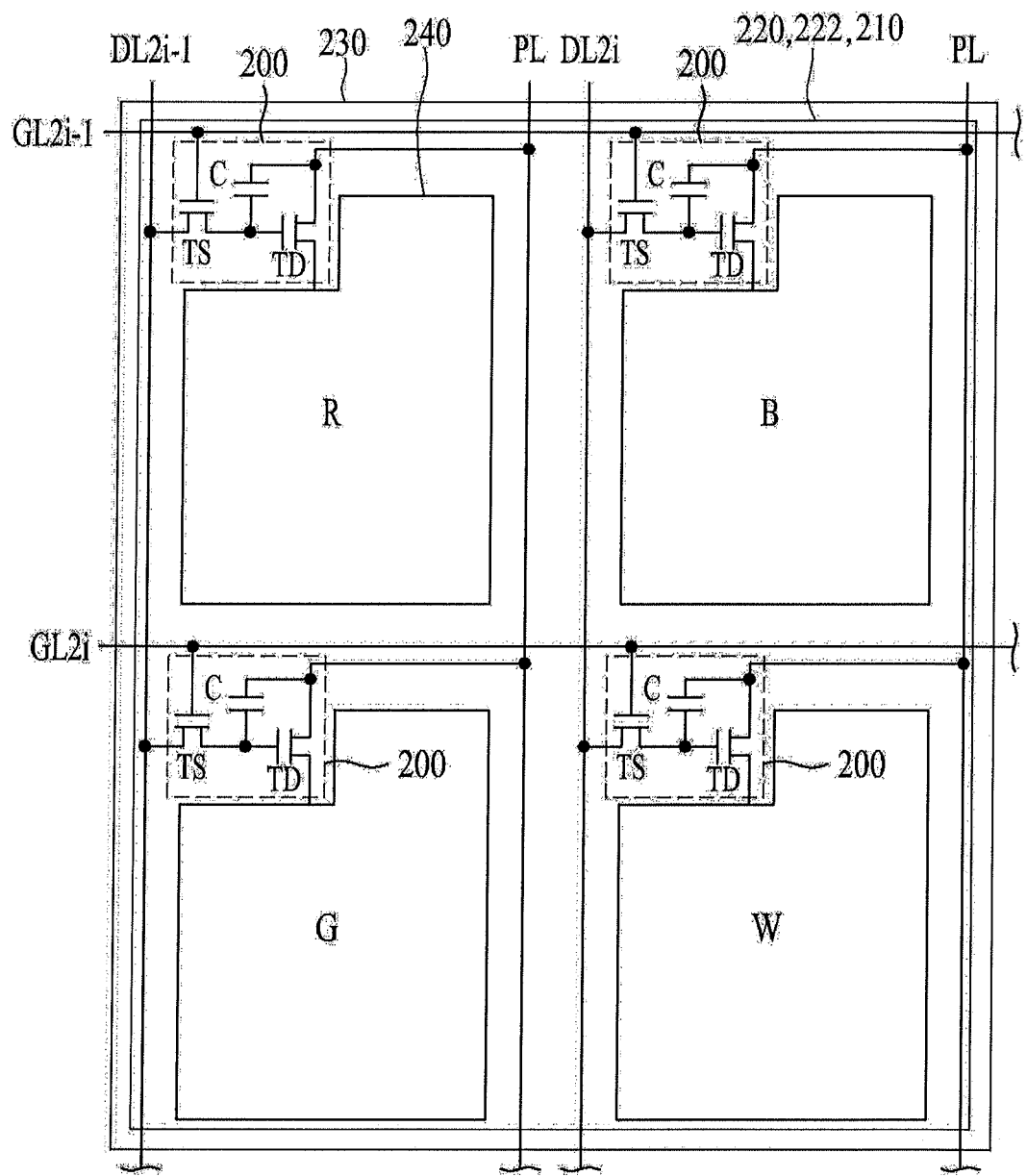
Figure 1D:
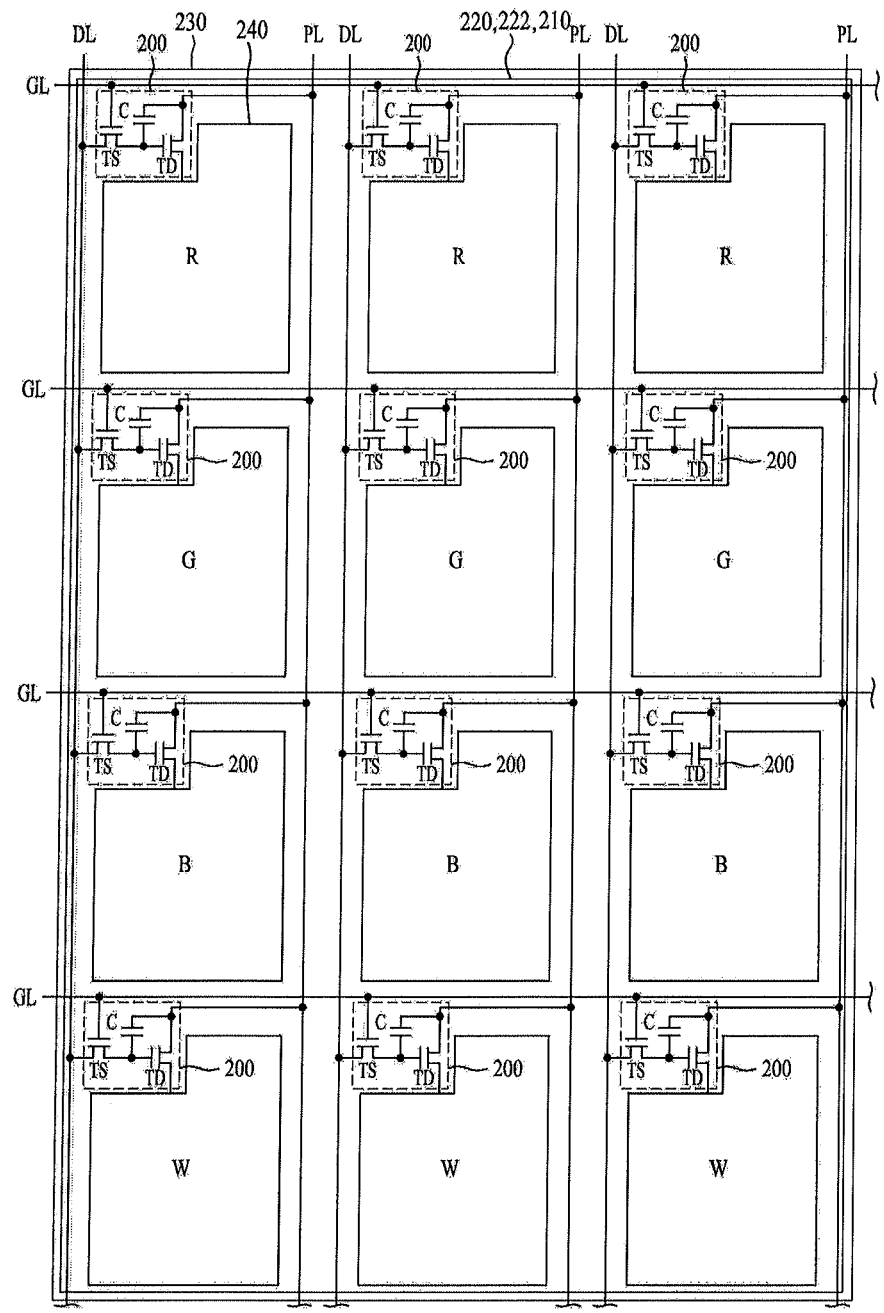

The R, B, G, and W sub-pixel regions may also be arrayed in a matrix with 2 rows and 2 columns as illustrated in FIGS. 1B and 1C. For example, as illustrated in FIG. 1B, the R sub-pixel region may be formed at an intersection between a $(2i-1)^{th}$ data line DL2i-1 and a $(2i-1)^{th}$ gate line GL2i-1, in which i is a natural number of 1 or greater. The G sub-pixel region may be formed at an intersection between a $2i^{th}$ data line DL2i and the $(2i-1)^{th}$ gate line GL2i-1. The B sub-pixel region may be formed at an intersection between the $(2i-1)^{th}$ data line DL2i-1 and the $2i^{th}$ gate line GL2i. The W sub-pixel region may be formed between at an intersection between the $2i^{th}$ data line DL2i and the $2i^{th}$ gate line GL2i.

In addition, as illustrated in FIG. 10, the R sub-pixel region may be formed at an intersection between the $(2i-1)^{th}$ data line DL2i-1 and the $(2i-1)^{th}$ gate line GL2i-1. The B sub-pixel region may be formed at an intersection between the $2i^{th}$ data line DL2i and the $(2i-1)^{th}$ gate line GL2i-1. The G sub-pixel region may be formed at an intersection between the $(2i-1)^{th}$ data line DL2i-1 and the $2i^{th}$ gate line GL2i. The W sub-pixel region may be formed at an intersection between the $2i^{th}$ data line DL2i and the $2i^{th}$ gate line GL2i.

Each of the R, G, B, and W sub-pixel regions includes a cell drive unit 200 and a white organic light emitting device connected to the cell drive unit 200.

The cell drive unit 200 includes a switching thin film transistor TS that is connected to the gate line GL and the data line DL, a driving thin film transistor TD that is connected to the switching thin film transistor TS and between a power line PL and a first electrode 242 of the white organic light emitting device, and a storage capacitor C that is connected between the power line PL and a drain electrode 110 of the switching thin film transistor TS. The sub-pixel regions may have a structure including a switching transistor, a driving transistor, a capacitor, and an organic light emitting device or a structure further including a transistor and a capacitor. In addition, the driving thin film transistor may be directly connected to the first electrode of the white organic light emitting device, or another thin film transistor may further be formed between the driving thin film transistor and the white organic light emitting device.

The gate electrode of the switching thin film transistor TS is connected to the gate line G, the source electrode is connected to the data line DL, and the drain electrode is connected to the gate electrode of the driving thin film transistor TD and the storage capacitor C. The source electrode of the driving thin film transistor TD is connected to the power line PL, and the drain electrode 110 is connected to the first electrode 242. The storage capacitor C is connected between the power line PL and the gate electrode of the driving thin film transistor TD.

The switching thin film transistor TS is turned on when a scan pulse is supplied to the gate line GL to provide a data signal supplied to the data line DL to the storage capacitor C and the gate electrode of the driving thin film transistor TD. The driving thin film transistor TD controls current I supplied from the power line PL to the organic light emitting device in response to the data signal supplied to the gate electrode, thereby controlling the amount of light emitted by the organic light emitting device. In addition, even when the switching thin film transistor TS is turned off, the driving thin film transistor TD supplies a constant current I by a voltage charged in the storage capacitor c until a data signal of a subsequent frame is supplied thereto, so that emission of the organic light emitting device is maintained.

The driving thin film transistor TD includes, as illustrated in FIG. 2, a gate electrode 102 formed on a substrate 100 and connected to the gate line GL, a gate insulating layer 112 formed on the gate electrode 102, an oxide semiconductor layer 114 formed to overlap the gate electrode 102 such that the gate insulating layer 112 is interposed therebetween, an etch stopper 106 formed on the oxide semiconductor layer 114 to prevent the oxide semiconductor layer 114 from being damaged by oxygen, a source electrode 108 connected to the data line DL, and a drain electrode 110 formed to face the source electrode 108. A first passivation layer 118 is further formed on the driving thin film transistor TD.

The oxide semiconductor layer 114 is formed of an oxide including at least one metal selected from the group consisting of Zn, Cd, Ga, In, Sn, Hf, and Zr. The thin film transistor including the oxide semiconductor layer 114 has higher charge mobility and lower leakage current characteristics, compared with a thin film transistor including a silicon semiconductor layer. Furthermore, since the silicon semiconductor layer-containing thin film transistor is fabricated via a high-temperature process by crystallizing the silicon semiconductor layer, uniformity decreases during the crystallization process as the area of the silicon semiconductor layer increases. On the other hand, the oxide semiconductor layer 114-containing thin film transistor may be processed at a low temperature so as to be suitable to a large area.

An R color filter 124R, a G color filter 124G, and a B color filter 124B are formed on the first passivation layer 118. The R color filter 124R is formed on the first passivation layer 118 at the R sub-pixel region, and red light R is emitted as white light emitted from the white organic light emitting device passes through the R color filter 124R. The G color filter 324G is formed on the first passivation layer 318 at the G sub-pixel region, and green light G is emitted as white light emitted from the white organic light emitting device passes through the G color filter 324G. The B color filter 324B is formed on the first passivation layer 318 at the B sub-pixel region, and blue light B is emitted as white light emitted from the white organic light emitting device passes through the B color filter 324B. A color filter is not formed on the first passivation layer 118 at the W sub-pixel region, and white light W is emitted therefrom. In addition, a second passivation layer 126 is formed on each of the R, G, and B color filters 124R, 124G, and 124B.

Referring to FIGS. 2 to 4, the white organic light emitting device has a multi-stack structure including a first electrode 242 connected to the drain electrode 110 of the driving thin film transistor TD, a second electrode opposite to the first electrode 242, a bank insulating layer 130 having a bank hole exposing the first electrode 242, and a first stack 210, a charge generation layer 220, and a second stack 230, which are disposed between the first electrode 242 and the second electrode 244. Such white organic light emitting device having a multi-stack structure includes at least two stacks respectively including light emitting layers emitting light of different colors. White light is produced as light of different colors emitted from the light emitting layers are mixed. In addition, a bottom-emission type in which light emitted from first and second light emitting layers 218 and 234 is emitted toward the bottom side is illustrated in FIG. 3. However, the white organic light emitting device according to the first embodiment may also be manufactured as a top-emission type or both side-emission type, without being limited thereto.

The first electrode 242, as an anode, is a transparent conductive electrode formed of transparent conductive oxide (TCO) such as indium tin oxide (ITO) and indium zinc oxide (IZO).

The second electrode 244, as a cathode, is formed of a reflective metallic material such as aluminum (Al). The second electrode 244 may be formed of gold (Au), molybdenum (Mo), chromium (Cr), copper (Cu), LiF, or an alloy of aluminum and LiF.

The first stack 210 is disposed between the first electrode 242 and the charge generation layer 220 and includes a hole injection layer (HIL) 214, a first hole transport layer (HTL1) 216, a first light emitting layer (EML1) 218, and a first electron transport layer (ETL1) 212, which are sequentially stacked. In this regard, the first light emitting layer 218 is a light emitting layer including a fluorescent blue dopant and a host and emits blue light. In addition, a hole transport layer formed of a different material from the first hole transport layer 216 may further be disposed between the first hole transport layer 216 and the first light emitting layer 218, and an electron transport layer formed of a different material from the first electron transport layer 212 may further be disposed between the first electron transport layer 212 and an N-type charge generation layer 220a.

The second stack 230 is disposed between the second electrode 244 and the charge generation layer 220 and includes a second hole transport layer (HTL2) 232, a second light emitting layer (EML2) 234, and a second electron transport layer (ETL2) 236, which are sequentially stacked. In this regard, the second light emitting layer 234 is a light emitting layer including one or two hosts and a phosphorescent yellow-green dopant and emits yellow-green light. Alternatively, the second light emitting layer 234 may include one or two hosts and a phosphorescent red-green dopant. A hole transport layer formed of a different material from the second hole transport layer 232 may further be disposed between the second hole transport layer 232 and the second light emitting layer 234, and an electron transport layer formed of a different material from the second electron transport layer 236 may further be disposed between the second electron transport layer 236 and the second electrode 244.

As described above, the first light emitting layer 218 of the first stack 210 may include a fluorescent blue dopant and a host, and the second light emitting layer 234 of the second stack 230 may include one or two hosts and a phosphorescent yellow-green dopant. Alternatively, the first light emitting layer 218 of the first stack 210 may include a fluorescent blue dopant and a host, and the second light emitting layer 234 of the second stack 230 may include one or two hosts, a phosphorescent red dopant, and a phosphorescent green dopant.

The charge generation layer (CGL) 220 is disposed between the stacks to control charge balance therebetween. The charge generation layer 220 includes a P-type charge generation layer (P-CGL) 220b that is disposed adjacent to the second stack 230 and performs generation and injection of electrons and holes and an N-type charge generation layer (N-CGL) 220a that injects electrons into the first electron transport layer 212 of the first stack 210.

In other words, the P-type charge generation layer 220b generates holes and electrons, injects the generated holes into the second hole transport layer 232 of the adjacent second stack 230, and injects the generated electrons into the N-type charge generation layer 220a. The P-type charge generation layer 220b may be doped with 1% to 20% of a hole transport material to facilitate generation of holes and injection of the holes into the second hole transport layer 232 of the second stack 230.

The hole transport material doped in the P-type charge generation layer 220b may have a mobility of $5.0 \times 10^{-5}$ cm$^2$/Vs to $1.0 \times 10^{-2}$ cm$^2$/Vs. The hole transport material doped in the P-type charge generation layer 220b may have a highest occupied molecular orbital (HOMO) level of 5.0 eV to 6.0 eV and a lowest unoccupied molecular orbital (LUMO) level of 2.0 eV to 3.5 eV. For example, the hole transport material doped in the P-type charge generation layer 220b may include at least one selected from the group consisting of N,N-dinaphthyl-N,N'-diphenylbenzidine (NPD), N,N'-bis-3-methylphenyl)-N,N'-bis-(phenyl)-benzidine) (TPD), s-TAD, and 4,4',4"-tris(N-3-methylphenyl-N-phenyl-amino)-triphenylamine (MTDATA). Meanwhile, the P-type charge generation layer 220b may be doped with one hole transport material or two or more hole transport materials to obtain the same effects.

HAT(CN)6 is generally used to form the P-type charge generation layer 220b. The P-type charge generation layer 220b formed of HAT(CN)6 may have high driving voltage or reduced lifespan due to inefficient hole generation and hole injection.

However, a white organic light emitting display device including a P-type charge generation layer 220b formed of HAT(CN)6 doped with the hole transport material has a decreased driving voltage of 0.7 V to 0.9 V and an increased lifespan by 6% to 23% compared to a white organic light emitting display device including a P-type charge generation layer formed only of HAT(CN)6.

As described above, when the P-type charge generation layer 220b is doped with the hole transport material, holes are efficiently injected into the second hole transport layer 232, thereby reducing driving voltage.

Meanwhile, the second hole transport layer 232 of the second stack 320 may be formed by co-depositing the P-type charge generation layer 220b doped with the hole transport material and the second hole transport layer 232 of the second stack 230.

In addition, a buffer layer may further be disposed between the P-type charge generation layer 220b doped with the hole transport material and the N-type charge generation layer 220a.

Figure 5A:
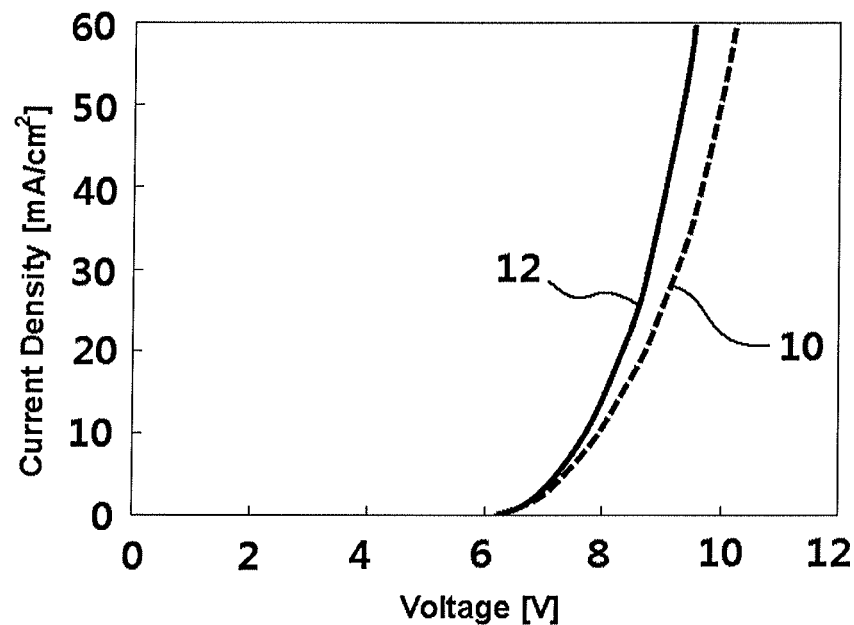
FIGS. 5A and 5B are graphs illustrating driving voltage and lifespan of a white organic light emitting device according to a comparative example and a white organic light emitting device including a P-type charge generation layer doped with a hole transport material according to Case A of the present invention.
Figure 5B:
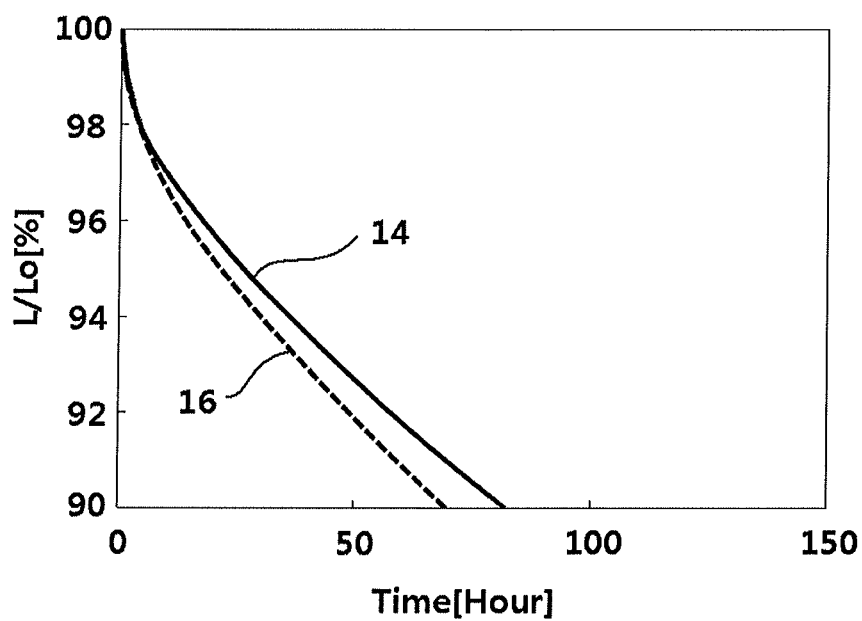

FIGS. 5A and 5B are graphs illustrating driving voltage and lifespan of a white organic light emitting device according to a comparative example and a white organic light emitting device including a P-type charge generation layer doped with a hole transport material according to Case A of the present invention.

A first curve 10 of FIG. 5A indicates driving voltage of the white organic light emitting device according to the comparative example. The white organic light emitting device according to the comparative example includes a first stack including a first light emitting layer, a charge generation layer including a P-type charge generation layer and an N-type charge generation layer, and a second stack including a second light emitting layer. Here, the P-type charge generation layer is formed only of HAT(CN)6.

A second curve 12 of FIG. 5A indicates driving voltage of the white organic light emitting device including the P-type charge generation layer doped with the hole transport material according to Case A of the present invention. The white organic light emitting device including the P-type charge generation layer doped with the hole transport material according to Case A includes a first stack including a first light emitting layer, a charge generation layer including a P-type charge generation layer and an N-type charge generation layer, and a second stack including a second light emitting layer. Here, the P-type charge generation layer includes HAT(CN)6 doped with the hole transport material of Case A. The hole transport material according to Case A has a mobility of $9.0 \times 10^{-3}$ cm$^2$/Vs, a LUMO level of 2.1 eV, and a HOMO level of 5.2 eV. In this regard, the hole transport material according to Case A is doped in an amount of 3% based on the volume of the P-type charge generation layer.

As illustrated in the first and second curves 10 and 12 of FIG. 5A, the driving voltage of the white organic light emitting device including the P-type charge generation layer formed of HAT(CN)6 doped with the hole transport material according to Case A is lower than the driving voltage of the white organic light emitting device including the P-type charge generation layer formed only of HAT(CN)6 according to the comparative example.

A first curve 14 of FIG. 5B indicates lifespan of the white organic light emitting device according to the comparative example, and a second curve 16 of FIG. 5B indicates lifespan of the white organic light emitting device including the P-type charge generation layer doped with the hole transport material according to Case A of the present invention.

As illustrated in the first and second curves 14 and 16 of FIG. 5B, the lifespan of the white organic light emitting device including the P-type charge generation layer formed of HAT(CN)6 doped with the hole transport material according to Case A of the present invention is longer than the lifespan of the white organic light emitting device including the P-type charge generation layer formed only of HAT(CN)6 according to the comparative example.

TABLE 1

| | P-CGL | 10 mA/cm$^2$ cd/A | 50 mA/cm$^2$ T90 | Volt (V) |
|---|---|---|---|---|
| Comparative example | HAT(CN)6 | 86 | 69 hours | 10.0 |
| Present invention | HAT(CN)6 + HTL3% (Case A) | 85 | 81 hours | 9.1 |

Based on the results shown in Table 1, while the white organic light emitting device according to the comparative example has a lifespan of 69 hours, the white organic light emitting device including the doped hole transport material according to Case A of the present invention has a lifespan of 81 hours. In this case, the T90 value of the lifespan refers to time for the device to reach a 90% of the lifespan. For example, it takes 81 hours for the white organic light emitting device including the doled hole transport material according to Case A according to the present invention to reach a 90% of the lifespan.

This indicates that doping of the hole transport material of Case A in the P-type charge generation layer facilitates hole injection, so that driving voltage decreases and lifespan increases.

Figure 6A:
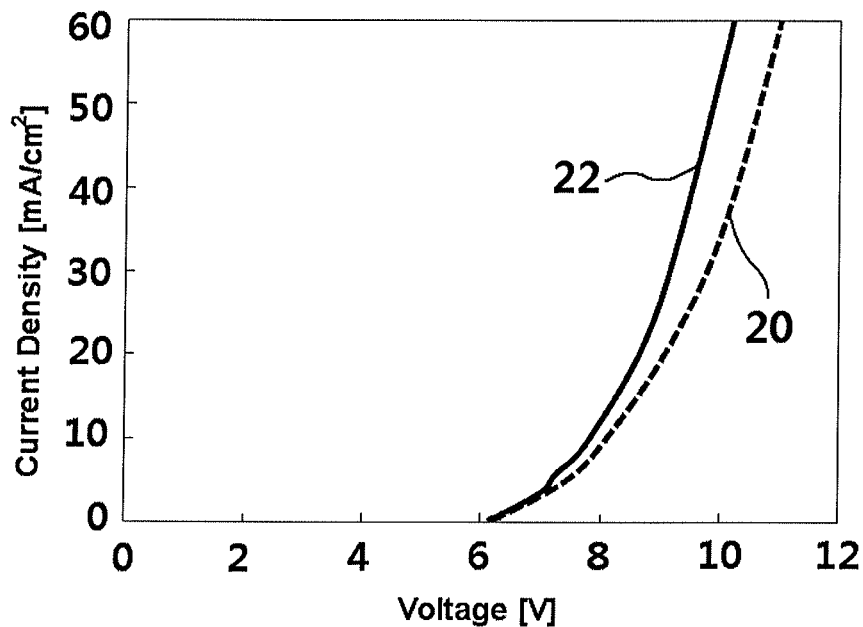
FIGS. 6A and 6B are graphs illustrating driving voltage and lifespan of a white organic light emitting device according to a comparative example and a white organic light emitting device including a P-type charge generation layer doped with a hole transport material according to Case B of the present invention.
Figure 6B:
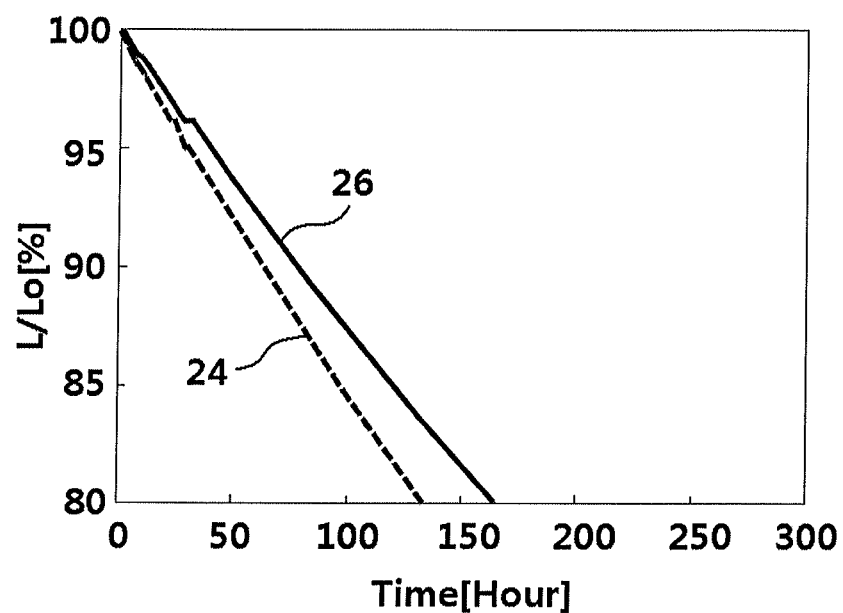

FIGS. 6A and 6B are graphs illustrating driving voltage and lifespan of a white organic light emitting device according to a comparative example and a white organic light emitting device including a P-type charge generation layer doped with a hole transport material according to Case B of the present invention.

A first curve 20 of FIG. 6A indicates driving voltage of the white organic light emitting device according to the comparative example. The white organic light emitting device according to the comparative example includes a first stack including a first light emitting layer, a charge generation layer including a P-type charge generation layer and an N-type charge generation layer, and a second stack including a second light emitting layer. Here, the P-type charge generation layer is formed only of HAT(CN)6.

A second curve 22 of FIG. 6A indicates driving voltage of the white organic light emitting device including the P-type charge generation layer doped with the hole transport material according to Case B of the present invention. The white organic light emitting device including the P-type charge generation layer doped with the hole transport material according to Case B includes a first stack including a first light emitting layer, a charge generation layer including a P-type charge generation layer and an N-type charge generation layer, and a second stack including a second light emitting layer. Here, the P-type charge generation layer includes HAT(CN)6 doped with the hole transport material of Case B. The hole transport material according to Case B has a mobility of $1.0 \times 10^{-4}$ cm$^2$/Vs, a LUMO level of 2.2 eV, and a HOMO level of 5.5 eV. In this regard, the hole transport material according to Case B is doped in an amount of 3% based on the volume of the P-type charge generation layer.

As illustrated in the first and second curves 20 and 22 of FIG. 6A, the driving voltage of the white organic light emitting device including the P-type charge generation layer formed of HAT(CN)6 doped with the hole transport material according to Case B is lower than the driving voltage of the white organic light emitting device including the P-type charge generation layer formed only of HAT(CN)6 according to the comparative example.

A first curve 24 of FIG. 6B indicates lifespan of the white organic light emitting device according to the comparative example, and a second curve 26 of FIG. 6B indicates lifespan of the white organic light emitting device including the P-type charge generation layer doped with the hole transport material according to Case B of the present invention.

As illustrated in the first and second curves 24 and 26 of FIG. 6B, the lifespan of the white organic light emitting device including the P-type charge generation layer formed of HAT(CN)6 doped with the hole transport material according to Case B of the present invention is longer than the lifespan of the white organic light emitting device including the P-type charge generation layer formed only of HAT(CN)6 according to the comparative example.

TABLE 2

| | P-CGL | 10 mA/cm$^2$ cd/A | 50 mA/cm$^2$ T80 | Volt (V) |
|---|---|---|---|---|
| Comparative example | HAT(CN)6 | 86 | 133 hours | 10.6 |
| Present invention | HAT(CN)6 + HTL3% (Case B) | 85 | 164 hours | 9.8 |

Based on the results shown in Table 2, while the T80 value of the lifespan of the white organic light emitting device according to the comparative example is 133 hours, the T80 value of the lifespan of the white organic light emitting device including the doped hole transport material according to Case B is 164 hours.

This indicates that doping of the hole transport material of Case B in the P-type charge generation layer facilitates hole injection, so that driving voltage decreases and lifespan increases.

Figure 7A:
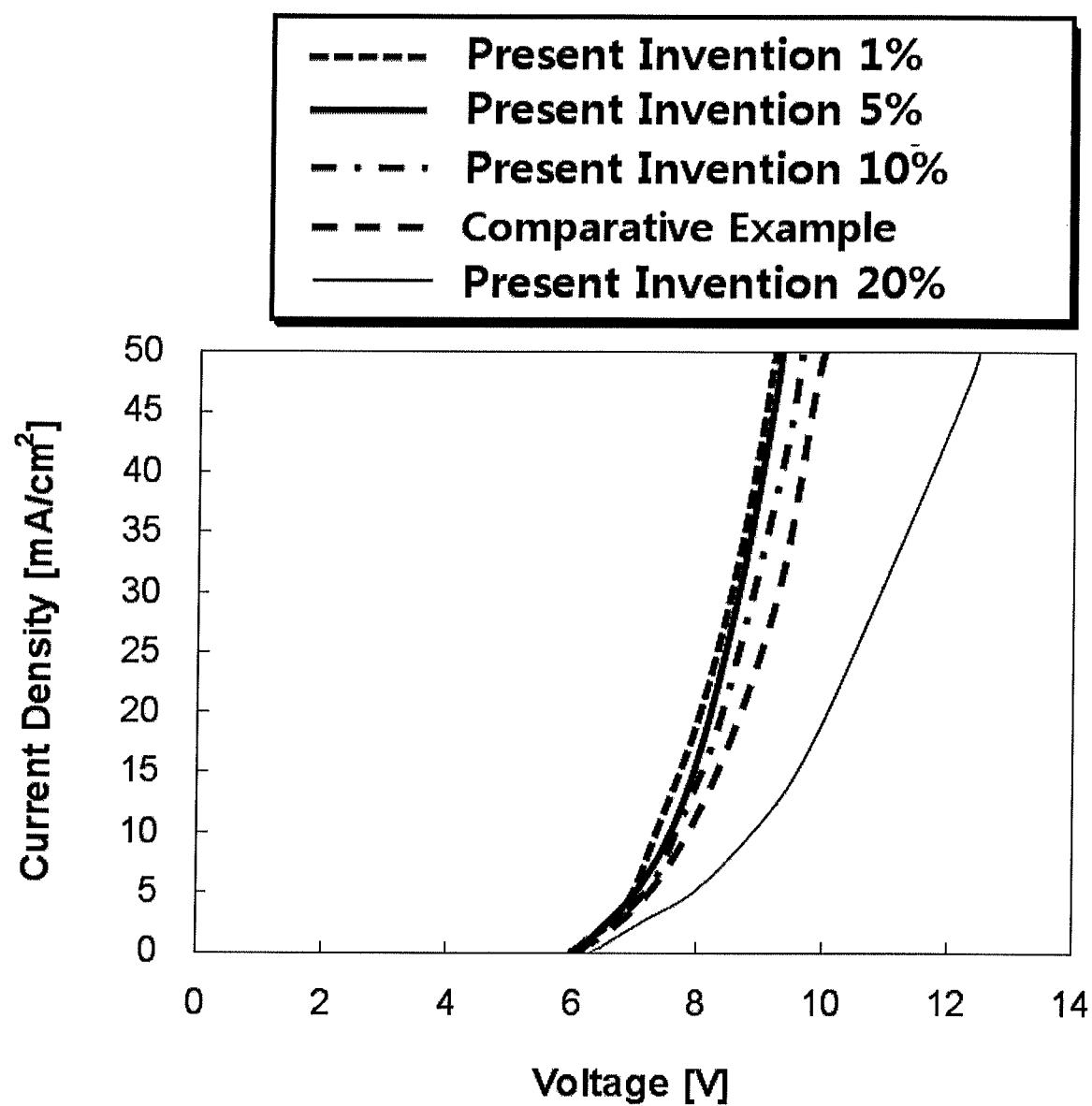
FIGS. 7A and 7B are graphs illustrating driving voltage and lifespan of a white organic light emitting device according to a comparative example and white organic light emitting devices each including a P-type charge generation layer doped with a hole transport material according to Case C of the present invention.
Figure 7B:
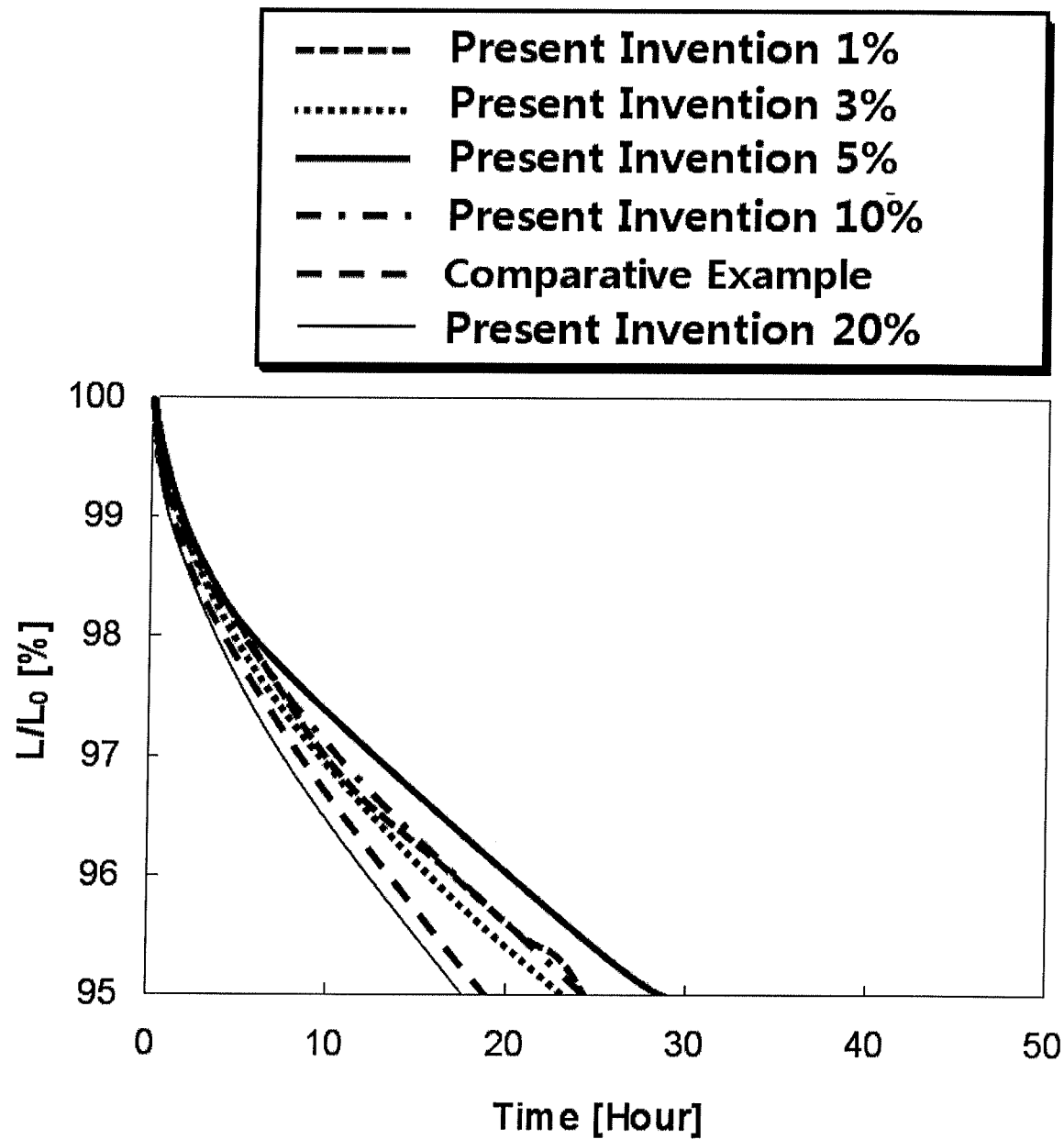

FIGS. 7A and 7B are graphs illustrating driving voltage and lifespan of a white organic light emitting device according to a comparative example and white organic light emitting devices each including a P-type charge generation layer doped with a hole transport material according to Case C of the present invention.

In the white organic light emitting device according to the comparative example of FIG. 7A, the P-type charge generation layer is formed only of HAT(CN)6. FIG. 7A illustrates driving voltage of the white organic light emitting device including the P-type charge generation layer formed only of HAT(CN)6.

FIG. 7A also illustrates driving voltage of white organic light emitting devices each including the P-type charge generation layer doped with the hole transport material according to Case C in different amounts. The P-type charge generation layer is formed of HAT(CN)6 doped with the hole transport material according to Case C. The hole transport material according to Case C has a mobility of $7.0 \times 10{-}3$ cm$^2$/Vs, a LUMO level of 2.5 eV, and a HOMO level of 5.4 eV. In this regard, the hole transport material according to Case C is doped in amounts of 1%, 3%, 5%, 10%, and 21%, respectively, based on the volume of the P-type charge generation layer.

As illustrated in FIG. 7A, the driving voltage of the white organic light emitting device including the P-type charge generation layer formed of HAT(CN)6 doped with the hole transport material according to Case C is lower than the driving voltage of the white organic light emitting device including the P-type charge generation layer formed only of HAT(CN)6 according to the comparative example.

As illustrated in FIG. 7B, the lifespan of most of the white organic light emitting devices each including the P-type charge generation layer doped with the hole transport material according to Case C of the present invention is longer than the lifespan of the white organic light emitting device according to the comparative example.

TABLE 3

| | P-CGL | 10 mA/cm$^2$ cd/A | 50 mA/cm$^2$ T95 | Volt (V) |
|---|---|---|---|---|
| Comparative example | HAT(CN)6 | 76.5 | 20 hours | 10.0 |
| Present invention | HAT(CN)6 + HTL1% (Case C) | 76.8 | 25 | 9.1 |
| | HAT(CN)6 + HTL3% (Case C) | 76.3 | 23 | 9.3 |
| | HAT(CN)6 + HTL5% (Case C) | 76.3 | 29 | 9.2 |
| | HAT(CN)6 + HTL10% (Case C) | 76.3 | 24 | 9.7 |
| | HAT(CN)6 + HTL21% (Case C) | 76.7 | 18 | 12.4 |

Based on the results shown in Table 3, while the T95 value of the lifespan of the white organic light emitting device according to the comparative example is 20 hours, the T95 values of the lifespan of the white organic light emitting device including the doped hole transport material according to Case C are in the range of 23 to 29 hours.

This indicates that doping of the hole transport material of Case C in the P-type charge generation layer facilitates hole injection, so that driving voltage decreases and lifespan increases.

Meanwhile, when the P-type charge generation layer is doped with 21% of the hole transport material according to Case C, the white organic light emitting device has higher driving voltage and shorter lifespan compared to that of the comparative example as shown in Table 3. Thus, the P-type charge generation layer 220b may be doped with 1 to 20% of the hole transport material according to the present invention.

Figure 8A:
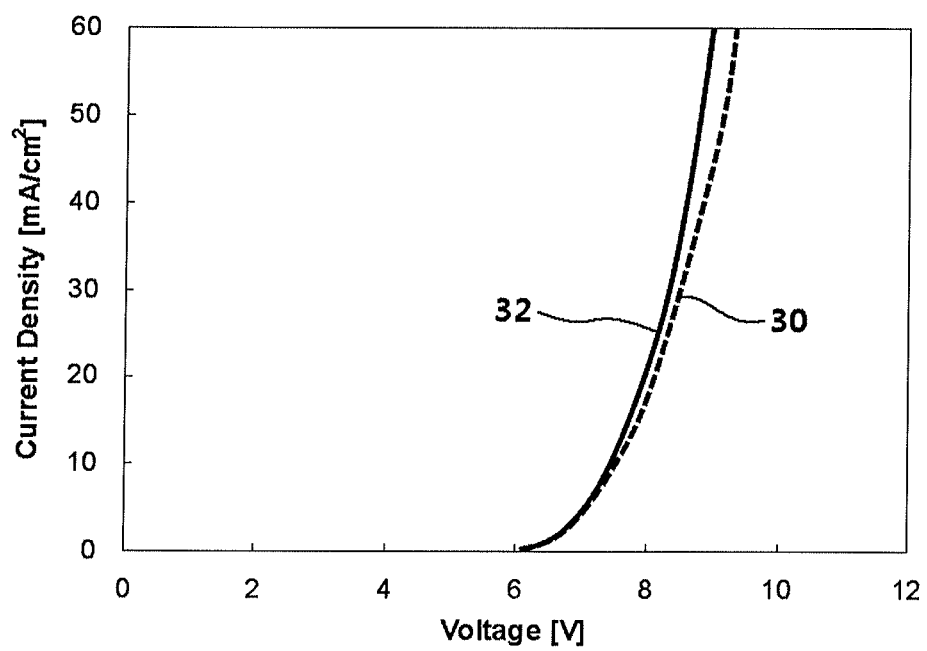
FIGS. 8A and 8B are graphs illustrating driving voltage and lifespan of a white organic light emitting device according to a comparative example and a white organic light emitting device including a P-type charge generation layer doped with a hole transport material according to Case D of the present invention.
Figure 8B:
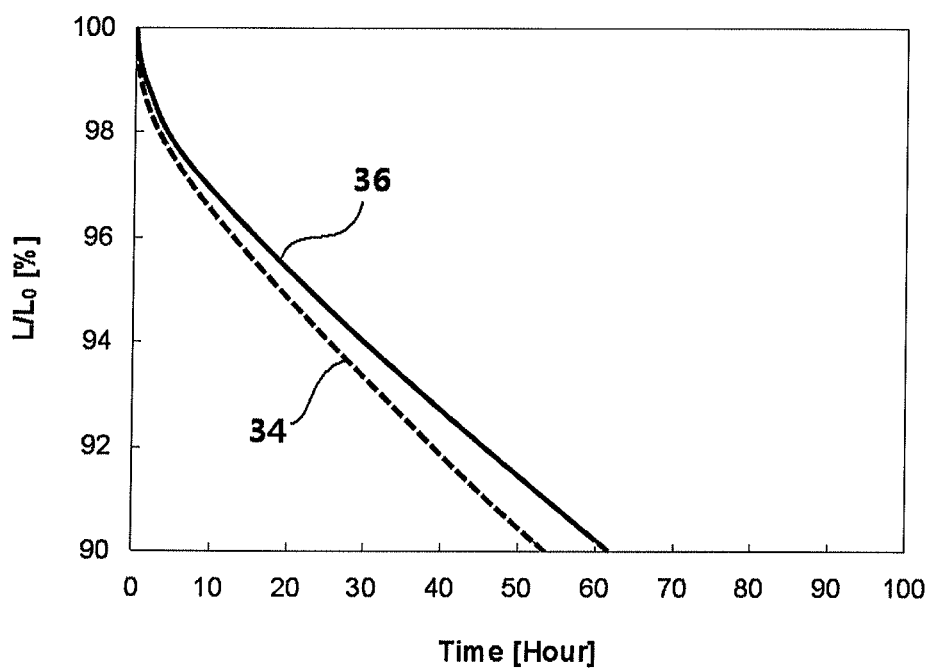

FIGS. 8A and 8B are graphs illustrating driving voltage and lifespan of a white organic light emitting device according to a comparative example and a white organic light emitting device including a P-type charge generation layer doped with a hole transport material according to Case D of the present invention.

A first curve 30 of FIG. 8A indicates driving voltage of the white organic light emitting device according to the comparative example. The white organic light emitting device according to the comparative example includes a first stack including a first light emitting layer, a charge generation layer including a P-type charge generation layer and an N-type charge generation layer, and a second stack including a second light emitting layer. Here, the P-type charge generation layer is formed only of HAT(CN)6.

A second curve 32 of FIG. 8A indicates driving voltage of the white organic light emitting device including the P-type charge generation layer doped with the hole transport material according to Case D of the present invention. The white organic light emitting device including the P-type charge generation layer doped with the hole transport material according to Case D includes a first stack including a first light emitting layer, a charge generation layer including a P-type charge generation layer and an N-type charge generation layer, and a second stack including a second light emitting layer. Here, the P-type charge generation layer includes HAT(CN)6 doped with the hole transport material of Case D. The hole transport material according to Case D has a mobility of $6.0 \times 10^{-4}$ cm$^2$/Vs, a LUMO level of 2.3 eV, and a HOMO level of 5.6 eV. In this regard, the hole transport material according to Case D is doped in an amount of 3% based on the volume of the P-type charge generation layer.

As illustrated in the first and second curves 30 and 32 of FIG. 8A, the driving voltage of the white organic light emitting device including the P-type charge generation layer formed of HAT(CN)6 doped with the hole transport material according to Case D is lower than the driving voltage of the white organic light emitting device including the P-type charge generation layer formed only of HAT(CN)6 according to the comparative example.

A first curve 34 of FIG. 8B indicates lifespan of the white organic light emitting device according to the comparative example, and a second curve 36 of FIG. 8B indicates lifespan of the white organic light emitting device including the P-type charge generation layer doped with the hole transport material according to Case D of the present invention.

As illustrated in the first and second curves 34 and 36 of FIG. 8B, the lifespan of the white organic light emitting device including the P-type charge generation layer formed of HAT(CN)6 doped with the hole transport material according to Case D of the present invention is longer than the lifespan of the white organic light emitting device including the P-type charge generation layer formed only of HAT(CN)6 according to the comparative example.

TABLE 4

| | P-CGL | 10 mA/cm$^2$ cd/A | 50 mA/cm$^2$ T90 | Volt (V) |
|---|---|---|---|---|
| Comparative example | HAT(CN)6 | 78 | 54 hours | 9.2 |
| Present invention | HAT(CN)6 + HTL3% (Case D) | 78 | 62 hours | 8.9 |

Based on the results shown in Table 4, while the T90 value of the lifespan of the white organic light emitting device according to the comparative example is 54 hours, the T90 value of the lifespan of the white organic light emitting device including the doped hole transport material according to Case D is 62 hours.

Figure 9A:
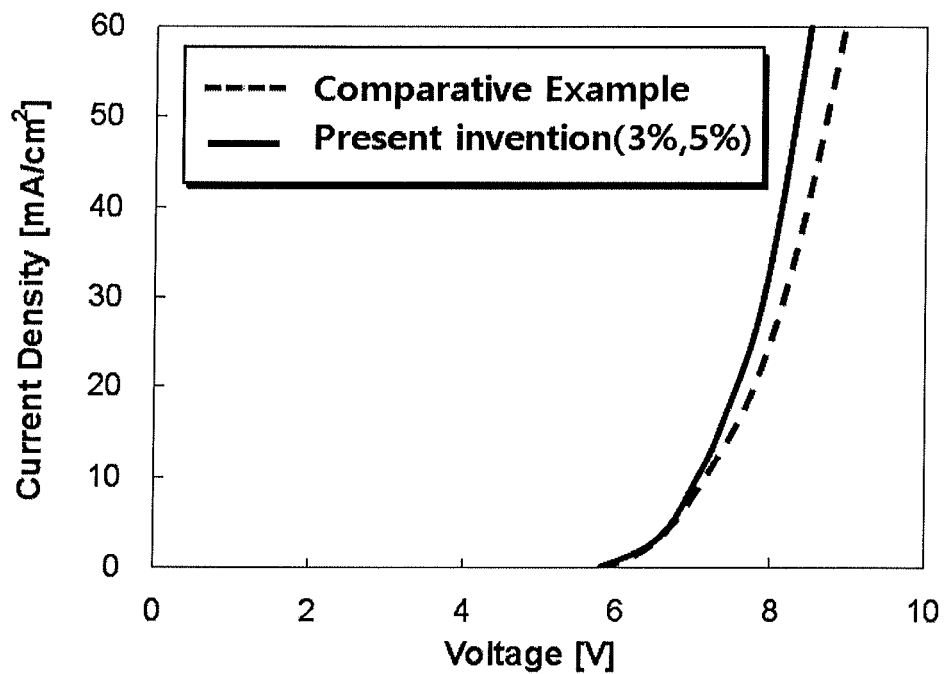
FIGS. 9A, 9B, 9C and 9D are graphs illustrating driving voltage and lifespan of a white organic light emitting device according to a comparative example and white organic light emitting devices each including a P-type charge generation layer doped with NPB or TPD, as a hole transport material, according to the present invention.
Figure 9B:
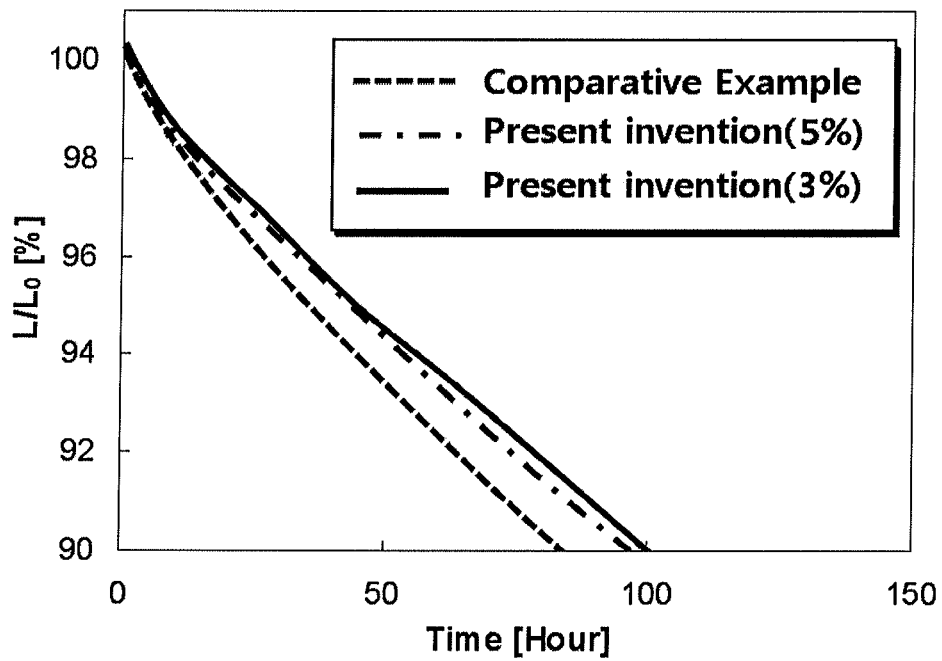

FIGS. 9A and 9B are graphs illustrating driving voltage and lifespan of a white organic light emitting device according to a comparative example and white organic light emitting devices each including a P-type charge generation layer doped with NPB or TPD, as a hole transport material, according to the present invention.

As illustrated in FIGS. 9A and 9B, the white organic light emitting devices including the P-type charge generation layers 220b doped with 3% and 5% of NPB according to the present invention have lower driving voltage and longer lifespan compared to the white organic light emitting device according to the comparative example. In particular, referring to Table 5, while the white organic light emitting device according to the comparative example has a driving voltage of 8.8 V, and the white organic light emitting devices including the P-type charge generation layers 220b doped with 3% and 5% of NPB according to the present invention have a driving voltage of 8.4 V. While the white organic light emitting device according to the comparative example has a T90 value of 82 hours, the white organic light emitting devices including the P-type charge generation layers 220b doped with 3% and 5% of NPB according to the present invention respectively have T90 values of 100 hours and 97 hours.

TABLE 5

| | P-CGL | 10 mA/cm$^2$ cd/A | 50 mA/cm$^2$ T90 | Volt (V) |
|---|---|---|---|---|
| Comparative example | HAT(CN)6 | 79 | 82 hours | 8.8 |
| Present invention 3% | HAT(CN)6 + NPB3% | 78 | 100 hours | 8.4 |
| Present invention 5% | HAT(CN)6 + NPB5% | 78 | 97 hours | 8.4 |

Figure 9C:
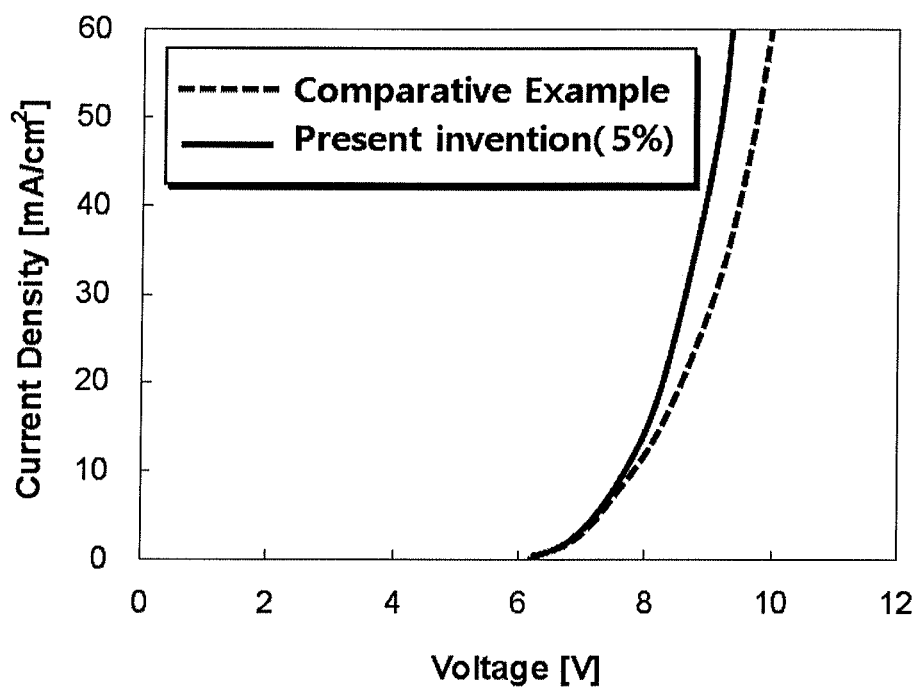
Figure 9D:
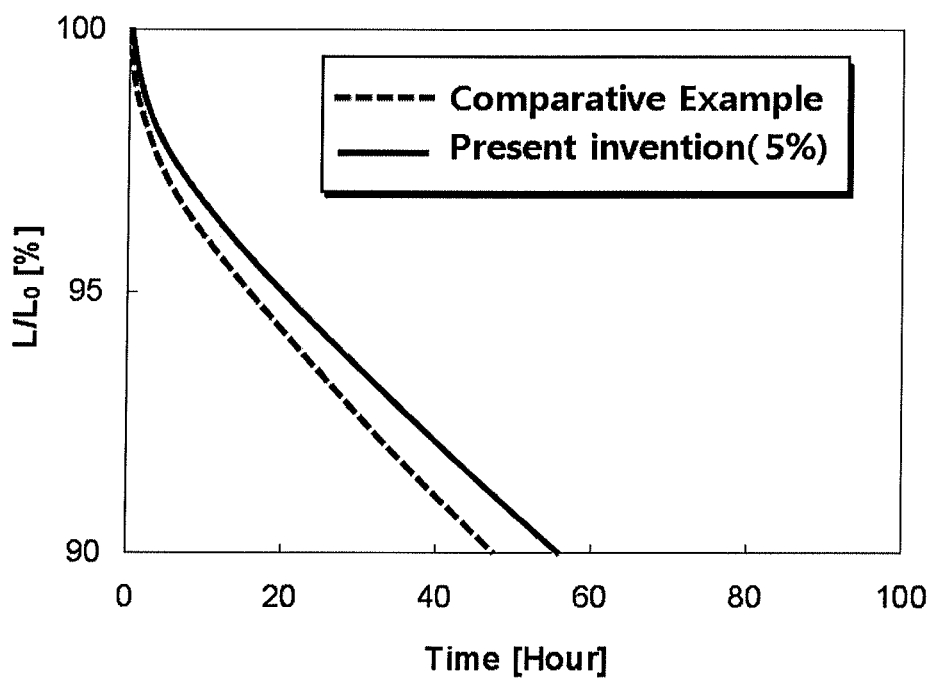

In addition, as illustrated in FIGS. 9C and 9D, lifespan of a white organic light emitting device including a P-type charge generation layer 220 doped with 5% of TPD has lower driving voltage and longer lifespan compared to the white organic light emitting device according to the comparative example.

TABLE 6

|  | | 10 mA/cm² | 50 mA/cm² | |
| --- | --- | --- | --- | --- |
| | P-CGL | cd/A | T90 | Volt (V) |
| Comparative example | HAT(CN)6 | 80 | 48 hours | 9.8 |
| Present invention 5% | HAT(CN)6 + TPD3% | 80 | 56 hours | 9.2 |

In particular, referring to Table 6, while the white organic light emitting device according to the comparative example has a driving voltage of 9.8 V, the white organic light emitting device including the P-type charge generation layer 220b doped with 5% of TPD according to the present invention has a driving voltage of 9.2 V. While the white organic light emitting device according to the comparative example has a T90 value of 48 hours, the white organic light emitting device including the P-type charge generation layer 220b doped with 5% of TPD according to the present invention has a T90 value of 56 hours.

Figure 10A:
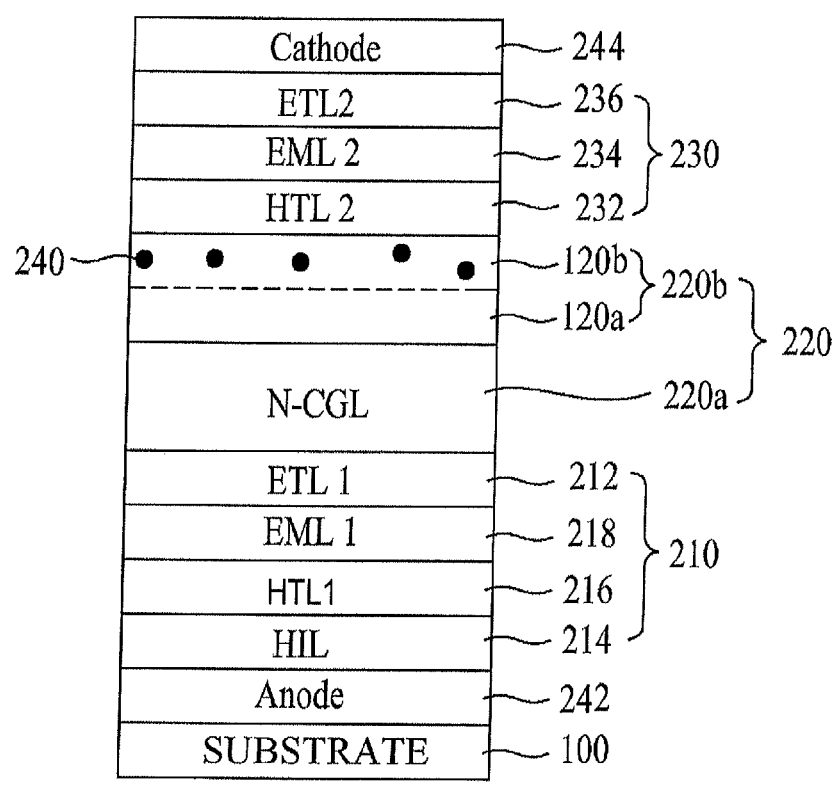
FIGS. 10A to 10C are cross-sectional views illustrating a white organic light emitting device according to a second embodiment of the present invention.

FIGS. 10A to 10O are cross-sectional views illustrating an organic light emitting device according to a second embodiment of the present invention. The organic light emitting device illustrated in FIGS. 10A to 10O has the same structure as that illustrated in FIGS. 3 and 5, except that the P-type charge generation layer has a multi layer structure. Thus, a detailed description thereof will not be given.

The P-type charge generation layer 220b of FIGS. 10A and 10O includes first and second P-type charge generation layers 120a and 120b.

The first P-type charge generation layer 120a is formed of HAT(CN)6, and the second P-type charge generation layer 120b is formed by doping 1 to 20% of a hole transport material, as a dopant 240, on HAT(CN)6, as a host. Here, the dopant 240 that is a hole transport material may be the same material as the material used to form the first and second hole transport layers 216 and 236 of the first and second stacks 210 and 230 or may be a different material. For example, the hole transporting dopant 240 may include at least one selected from the group consisting of N,N-dinaphthyl-N,N'-diphenyl benzidine (NPD), N,N'-bis-3-methylphenyl)-N,N'-bis-(phenyl)-benzidine) (TPD), s-TAD, and 4,4',4"-tris(N-3-methylphenyl-N-phenyl-amino)-triphenylamine (MTDATA). Meanwhile, the first P-type charge generation layer 120a may be doped with one dopant 240 or two or more dopants 240 to obtain the same effect.

Figure 10B:
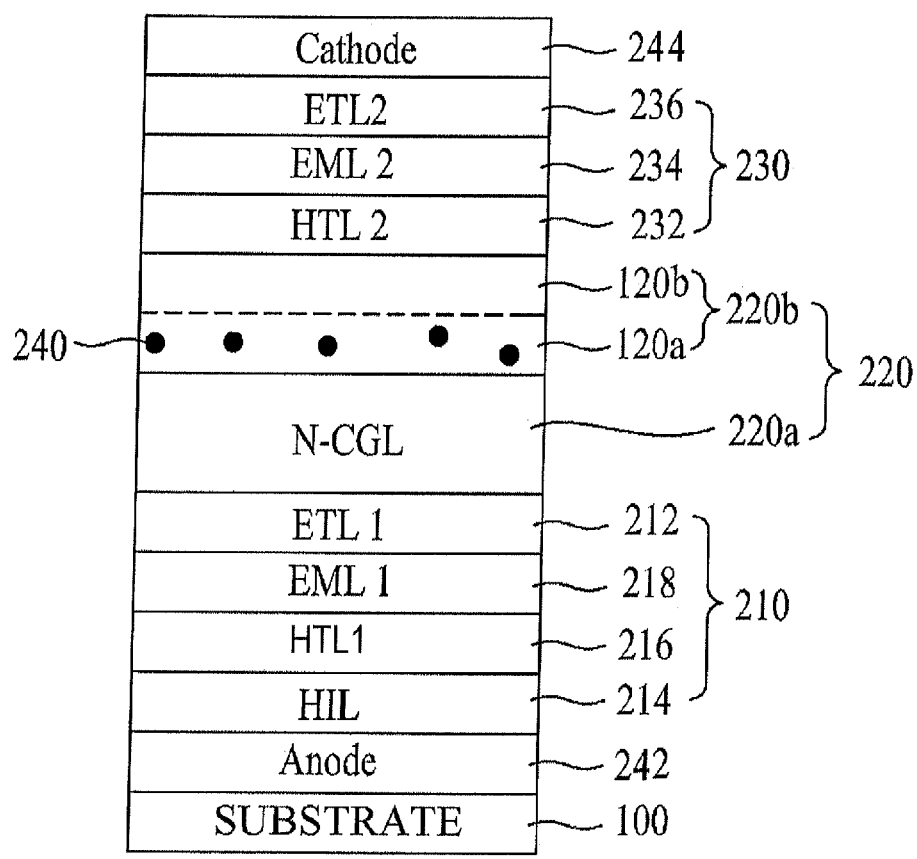

The second P-type charge generation layer 120b may also be disposed at any position in the P-type charge generation layer 220b. For example, the second P-type charge generation layer 120b may be disposed between the first P-type charge generation layer 120a and the second hole transport layer 232 as illustrated in FIG. 10A, between the N-type charge generation layer 220a and the first P-type charge generation layer 120a as illustrated in FIG. 10B, or between the two layers of a double-layered first P-type charge generation layer 120a as illustrated in FIG. 10O.

Figure 11A:
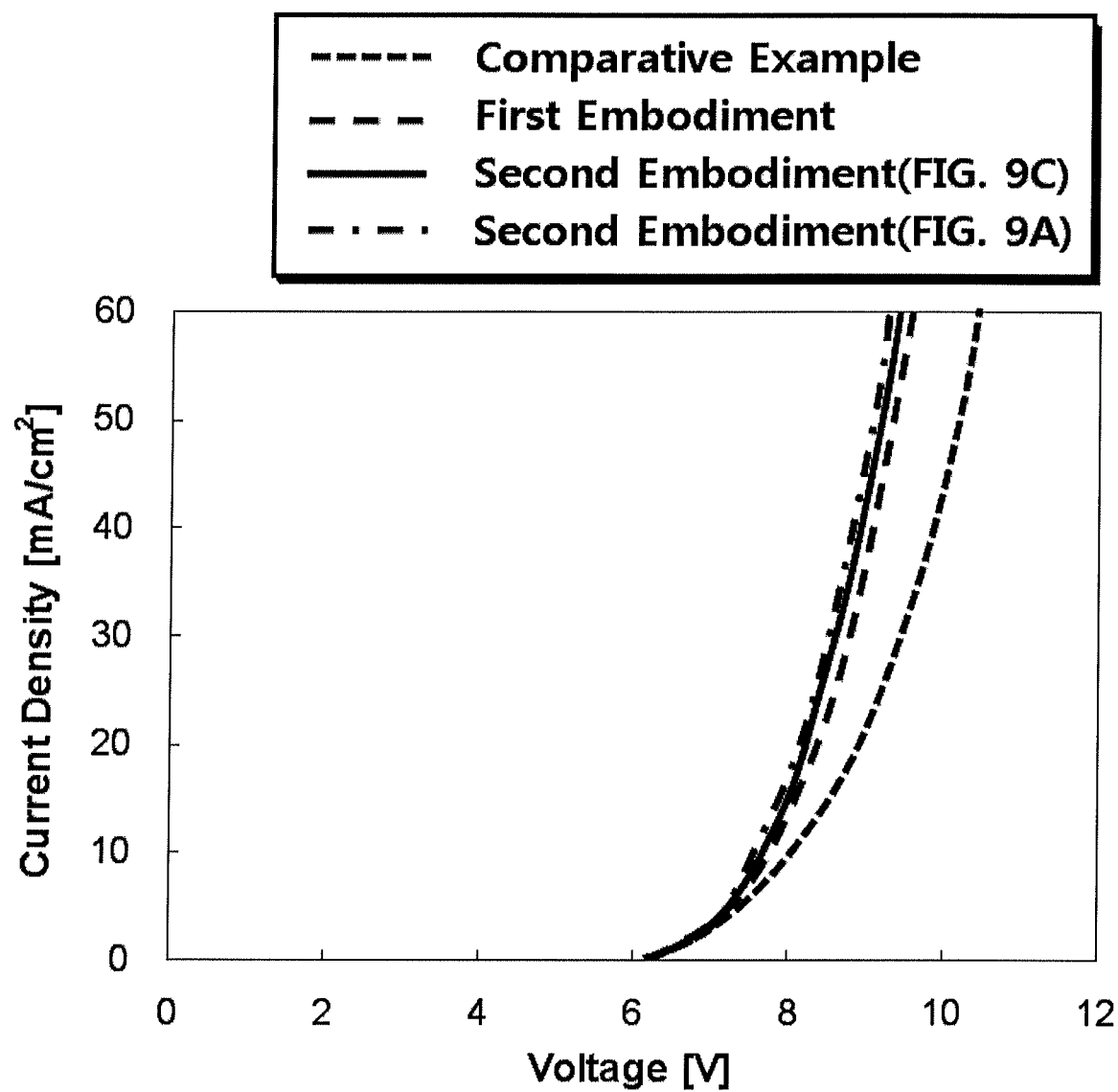
FIGS. 11A and 11B are graphs illustrating driving voltage and lifespan of a white organic light emitting device according to a comparative example and white organic light emitting devices according to the first and second embodiments of the present invention.
Figure 11B:
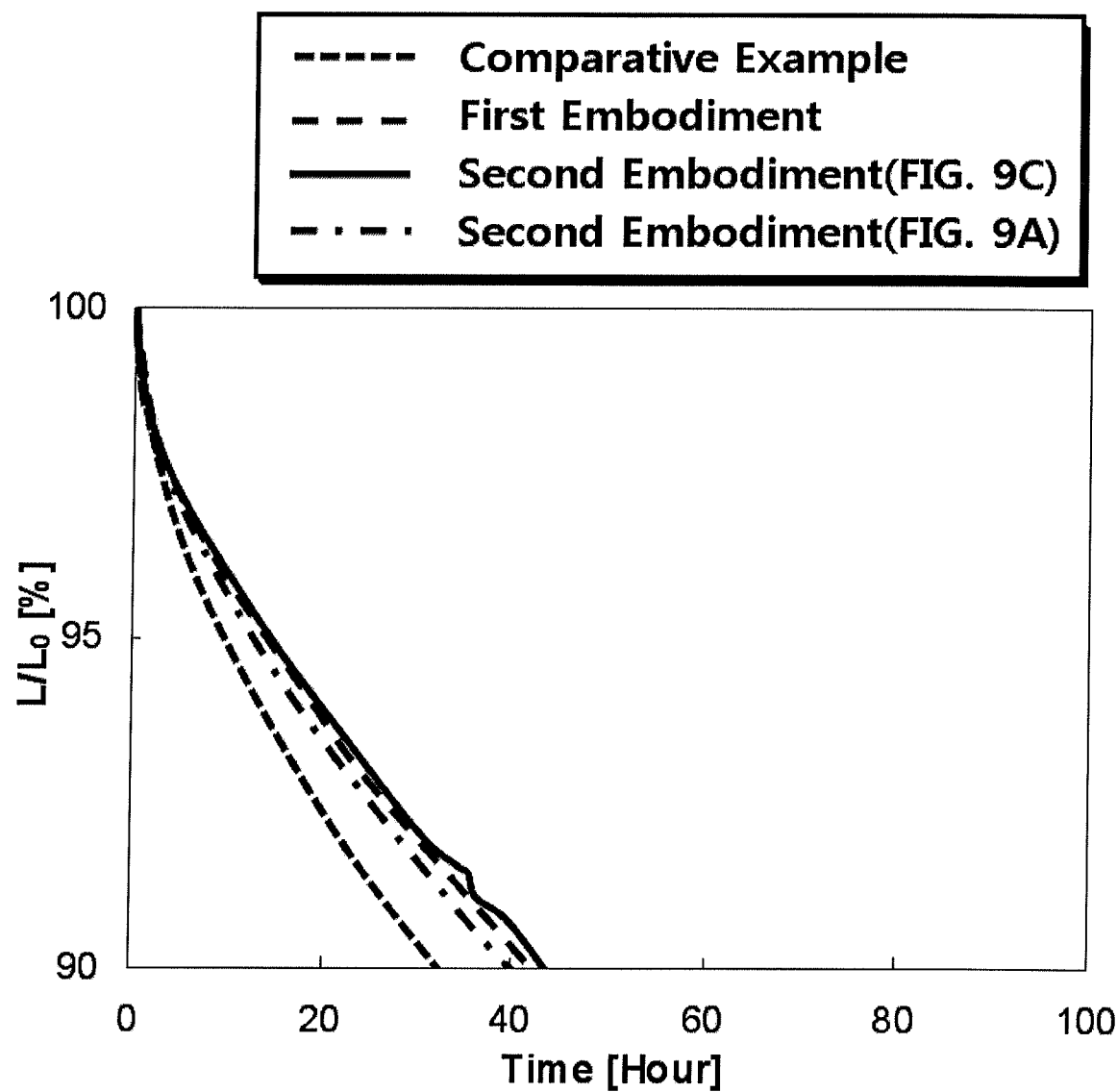

FIGS. 11A and 11B are graphs illustrating driving voltage and lifespan of a white organic light emitting device according to a comparative example and white organic light emitting devices according to the first and second embodiments of the present invention.

Referring to FIGS. 11A and 11B, the white organic light emitting devices illustrated in FIGS. 9A and 9C according to the second embodiment have similar driving voltage and lifespan to the white organic light emitting device according to the first embodiment in which the hole transport material is doped over the entire region of the P-type charge generation layer illustrated in FIGS. 3 and 4 and lower driving voltage and longer lifespan when compared with the white organic light emitting device according to the comparative example. In particular, based on the results shown in Table 7, the white organic light emitting device according to the comparative example has a driving voltage of 10.1 V, the organic light emitting devices according to the second embodiment of the present invention have a driving voltage of 9.1 V. While the white organic light emitting device according to the comparative example has a T90 value of 32 hours, the organic light emitting devices according to the second embodiment of the present invention have T90 values of 43 hours and 40 hours.

TABLE 7

| | P-type charge generation layer | | | 10 mA/cm² Cd/A | 50 mA/cm² | |
| --- | --- | --- | --- | --- | --- | --- |
| | | | | | T90 | Volt (V) |
| Comparative example | HAT(CN)6 | | | 80 | 32 hours | 10.1 |
| First embodiment | HAT(CN)6 + HTL5% | | | 80 | 42 hours | 9.3 |
| Second embodiment (FIG. 9C) | HAT(CN)6 | HAT(CN)6 + HTL5% | HAT(CN)6 | 80 | 43 hours | 9.1 |
| Second embodiment (FIG. 9A) | HAT(CN)6 | | HAT(CN)6 + HTL5% | 81 | 40 hours | 9.1 |

In addition, when the second P-type charge generation layer 120b has a thickness of x and the P-type charge generation layer 220b has a thickness of L, the thickness of the second P-type charge generation layer 120b is 10% or greater based on the total thickness of the P-type charge generation layer 220b and may satisfy Expression 1 below.

$$L \times 0.1 \leq x \leq L$$ [Expression 1]

Figure 12A:
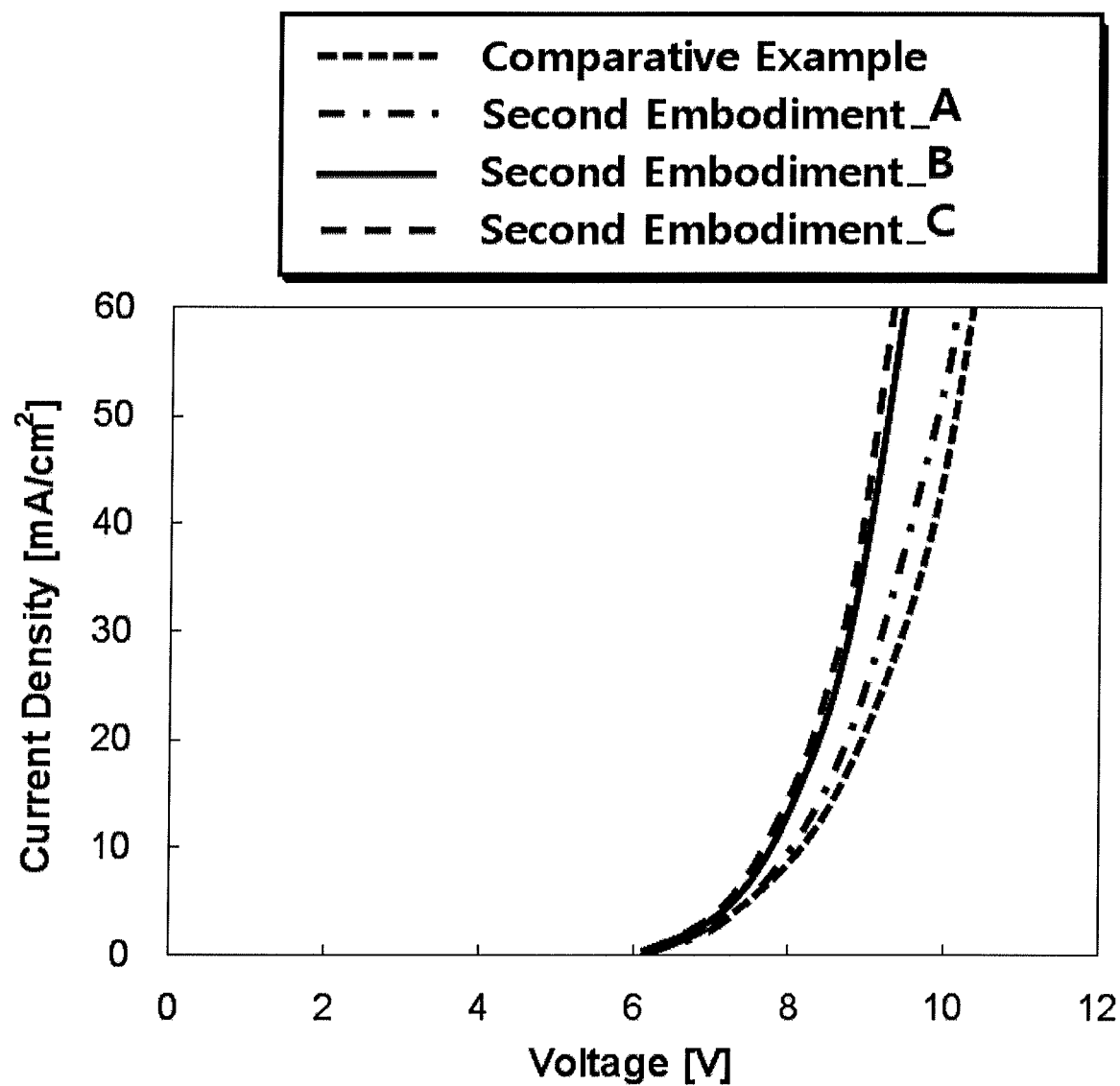
FIGS. 12A and 12B are graphs illustrating driving voltage and lifespan of a white organic light emitting device according to a comparative example and white organic light emitting devices according to the second embodiment of the present invention according to thickness of first and second P-type charge generation layers.
Figure 12B:
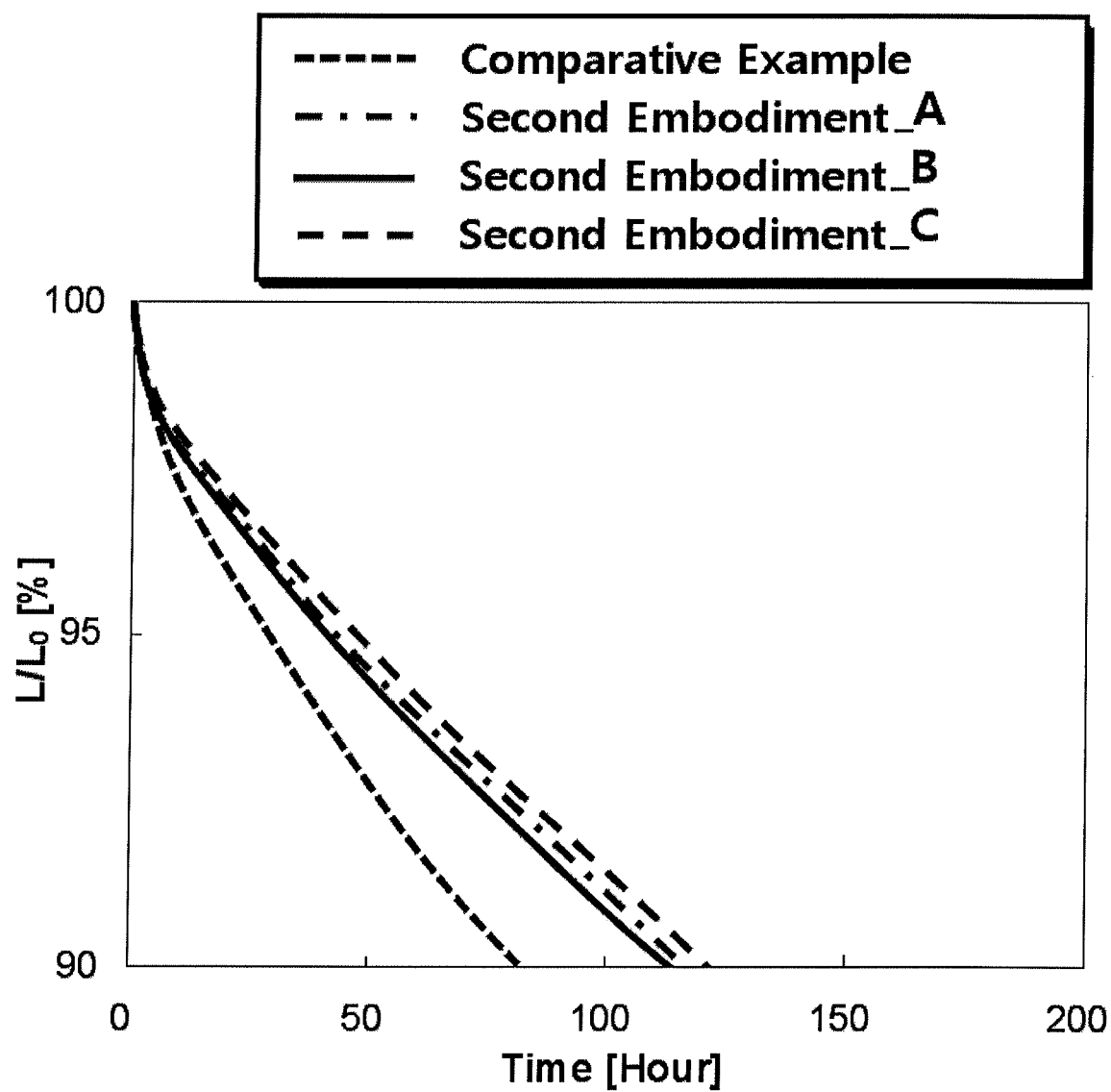

FIGS. 12A and 12B are graphs illustrating driving voltage and lifespan of a white organic light emitting device according to a comparative example and white organic light emitting devices according to the second embodiment of the present invention according to thickness of first and second P-type charge generation layers.

Referring to FIGS. 12A and 12B, when the thickness of the second P-type charge generation layer 120b is greater than 10%, for example, 20 to 100 Å, than the total thickness, for example, 200 Å, of the P-type charge generation layer 220b, the white organic light emitting device according to the second embodiment of the present invention has lower driving voltage and longer lifespan compared with the white organic light emitting device according to the comparative example. Particularly, based on the results shown in Table 8, while the white organic light emitting device according to the comparative example has a driving voltage of 10.2 V, the organic light emitting devices according to the second embodiment of the present invention have driving voltages ranging from 9.3 V to 9.9 V. While the white organic light emitting device according to the comparative example has a T90 value of 80 hours, the organic light emitting devices according to the second embodiment of the present invention have T90 values ranging from 113 hours to 121 hours.

TABLE 8

| | P-type charge generation layer | | 10 mA/cm² | 50 mA/cm² | |
|---|---|---|---|---|---|
| | | | Cd/A | T90 | Volt (V) |
| Comparative example | HAT(CN)6 (200Å) | | 81 | 80 hours | 10.2 |
| Second embodiment A | HAT(CN)6 (180Å) | HAT(CN)6 + HTL5% (20Å) | 80 | 117 hours | 9.9 |
| Second embodiment B | HAT(CN)6 (150Å) | HAT(CN)6 + HTL5% (50Å) | 80 | 113 hours | 9.4 |
| Second embodiment C | HAT(CN)6 (100Å) | HAT(CN)6 + HTL5% (100Å) | 82 | 121 hours | 9.3 |

Figure 13:
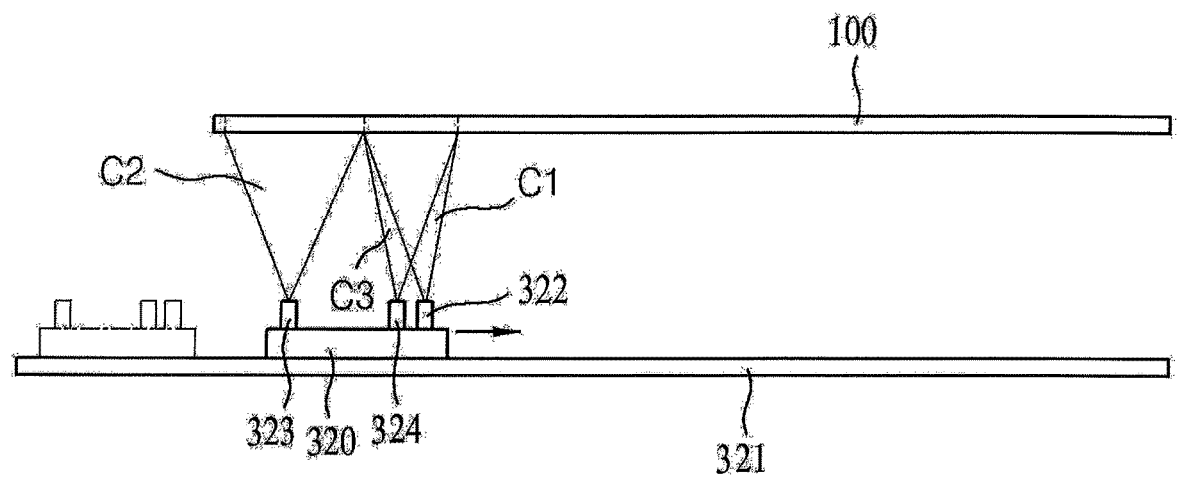
FIG. 13 is a diagram for describing a first example of an apparatus for manufacturing the P-type charge generation layer according to the present invention illustrated in FIG. 10B.

FIG. 13 is a diagram for describing a first example of an apparatus for manufacturing the P-type charge generation layer according to the present invention illustrated in FIG. 10B.

The apparatus illustrated in FIG. 13 includes a guide rail 321, a body 320 reciprocating along the guide rail 321, and first to third deposition sources 322, 323, and 324 disposed in the body 320. The first deposition source 322 ejects a dopant including a hole transport material toward a substrate 100 at a first ejection angle C1. The second and third deposition sources 323 and 324 eject a host including HAT(CN)6 toward the substrate 100 at a second ejection angle C2 overlapping the first ejection angle C1. The third deposition source 324 ejects the host including HAT(CN)6 toward the substrate 100 at a third ejection angle C3.

The deposition sources 322, 323, and 324 move on the guide rail 321 from one end to the other end thereof. Accordingly, the second P-type charge generation layer 120b formed of the dopant including the hole transport material ejected from the first deposition source 322 and the host including HAT(CN)6 ejected from the third deposition source 324 is disposed on the rear surface of the substrate 100. Then, the host including HAT(CN)6 ejected from the second deposition source 323 is formed on the second P-type charge generation layer 120b. As a result, a first P-type charge generation layer 120a is formed.

Figure 14:
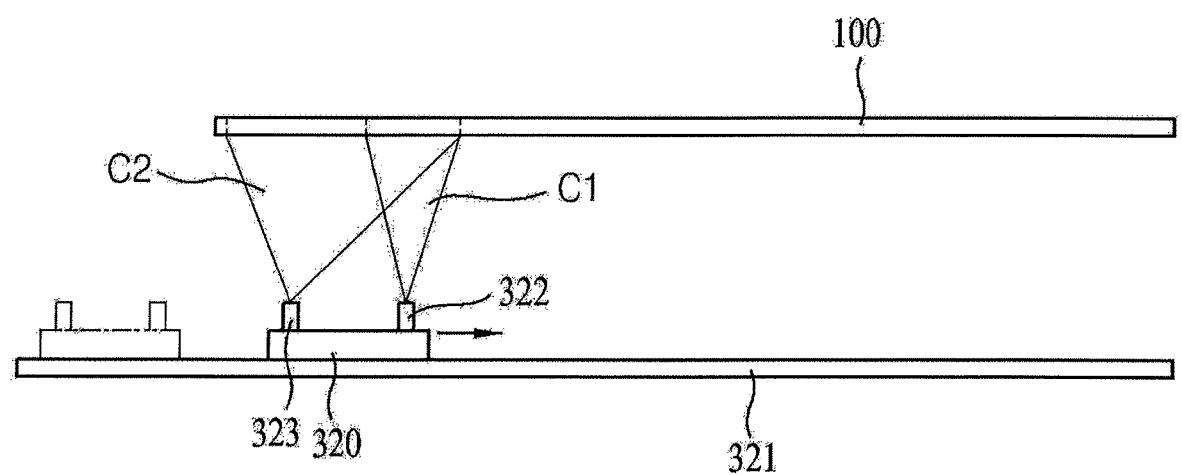
FIG. 14 is a diagram for describing a second example of an apparatus for manufacturing the P-type charge generation layer according to the present invention illustrated in FIG. 10B.

FIG. 14 is a diagram for describing a second example of an apparatus for manufacturing the P-type charge generation layer according to the present invention illustrated in FIG. 10B.

The apparatus illustrated in FIG. 14 includes a guide rail 321, a body 320 reciprocating along the guide rail 321, and first and second deposition sources 322 and 323 disposed in the body 320. The first deposition source 322 ejects a dopant including a hole transport material toward a substrate 100 at a first ejection angle C1. The second and third deposition source 323 ejects a host including HAT(CN)6 toward the substrate 100 at a second ejection angle C2 partially overlapping the first ejection angle C1.

A second P-type charge generation layer 120b formed of the dopant including both the hole transport material ejected from the first deposition source 322 and the host including HAT(CN)6 ejected from the third deposition source 323 is disposed on the rear surface of the substrate 100. The host including HAT(CN)6 ejected from the second deposition source 323 is formed on the second P-type charge generation layer 120b. As a result, a first P-type charge generation layer 120a is formed.

Figure 10C:
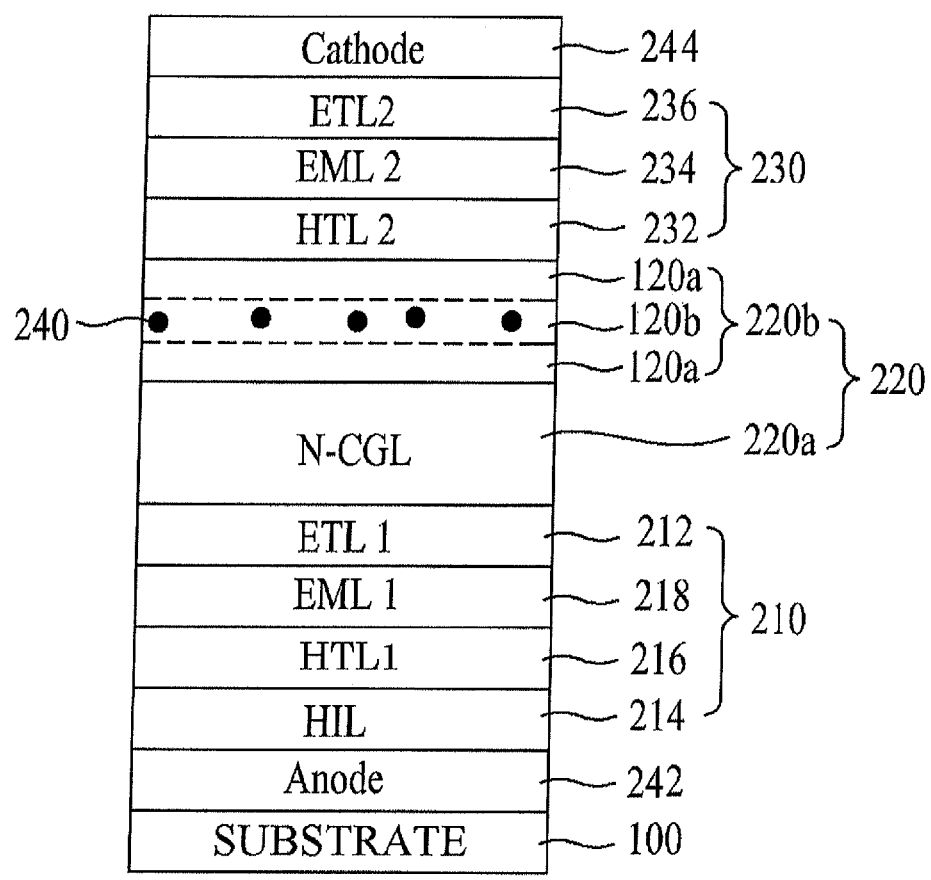
Figure 15:
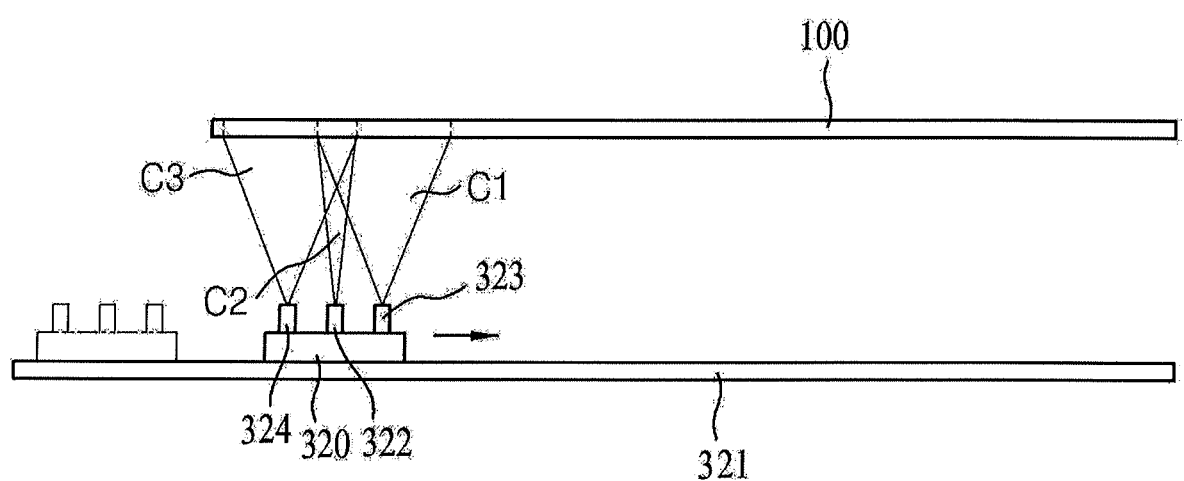
FIG. 15 is a diagram for describing a example of an apparatus for manufacturing the P-type charge generation layer according to the second embodiment of the present invention illustrated in FIG. 10O.

FIG. 15 is a diagram for describing a example of an apparatus for manufacturing the P-type charge generation layer according to the second embodiment of the present invention illustrated in FIG. 10C.

The apparatus illustrated in FIG. 15 includes a guide rail 321, a body 320 reciprocating along the guide rail 321, and first to third deposition sources 322, 323, and 324 disposed in the body 320. The first deposition source 322 ejects a dopant including a hole transport material toward a substrate 100 at a first ejection angle C1. The second deposition source 323 ejects a host including HAT(CN)6 toward the substrate 100 at a second ejection angle C2 partially overlapping the first ejection angle C1. The third deposition source 324 ejects the host including HAT(CN)6 toward the substrate 100 at a third ejection angle C3 partially overlapping the first ejection angle C1.

The deposition sources 322, 323, and 324 move on the guide rail 321 from one end to the other end thereof. Accordingly, a first P-type charge generation layer 120a is formed of the host including HAT(CN)6 ejected from the second deposition source 324, and then a second P-type charge generation layer 120b is formed of the dopant including the hole transport material ejected from the first deposition source 322 and the host including HAT(CN)6 ejected from the second and third deposition sources 323 and 324, sequentially on the rear surface of the substrate 100. Then, the host including HAT(CN)6 ejected from the third deposition source 324 is deposited thereon to form a first P-type charge generation layer 120a.

Meanwhile, the white organic light emitting device including the single-layered second P-type charge generation layer according to the second embodiment of the present invention has been described. However, as illustrated in FIGS. 16A to 16D, the P-type charge generation layer may have a multilayer structure.

Figure 16A:
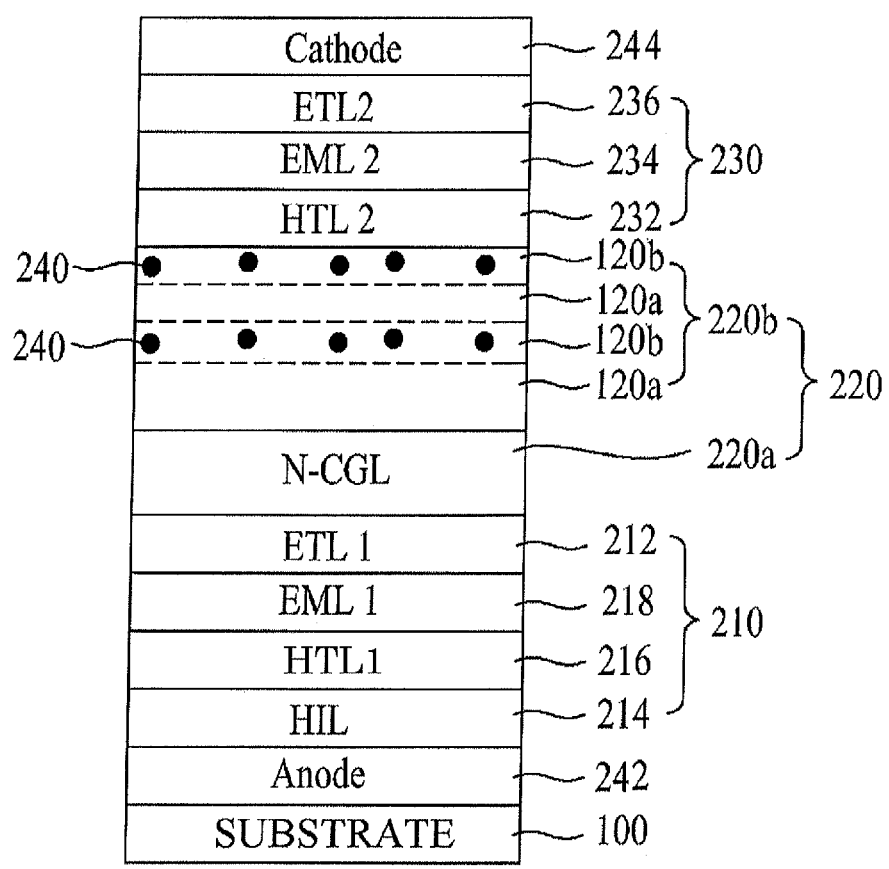
FIGS. 16A to 16D are cross-sectional views illustrating a white organic light emitting device according to a third embodiment of the present invention.
Figure 16B:
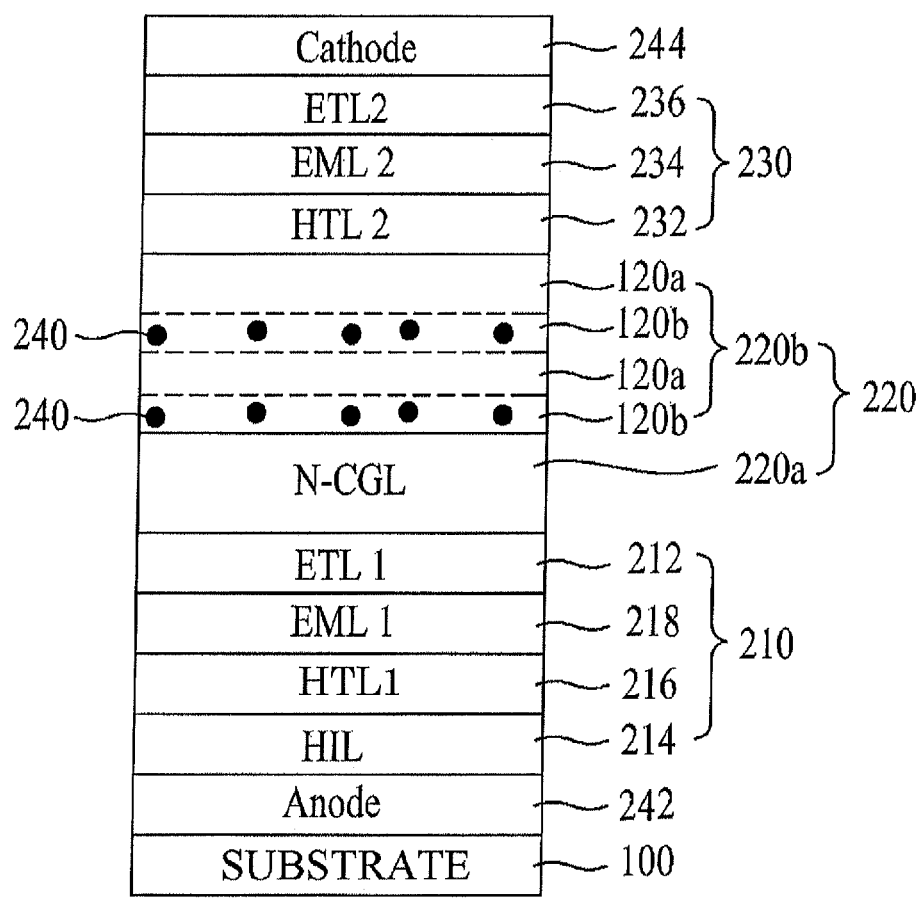
Figure 16C:
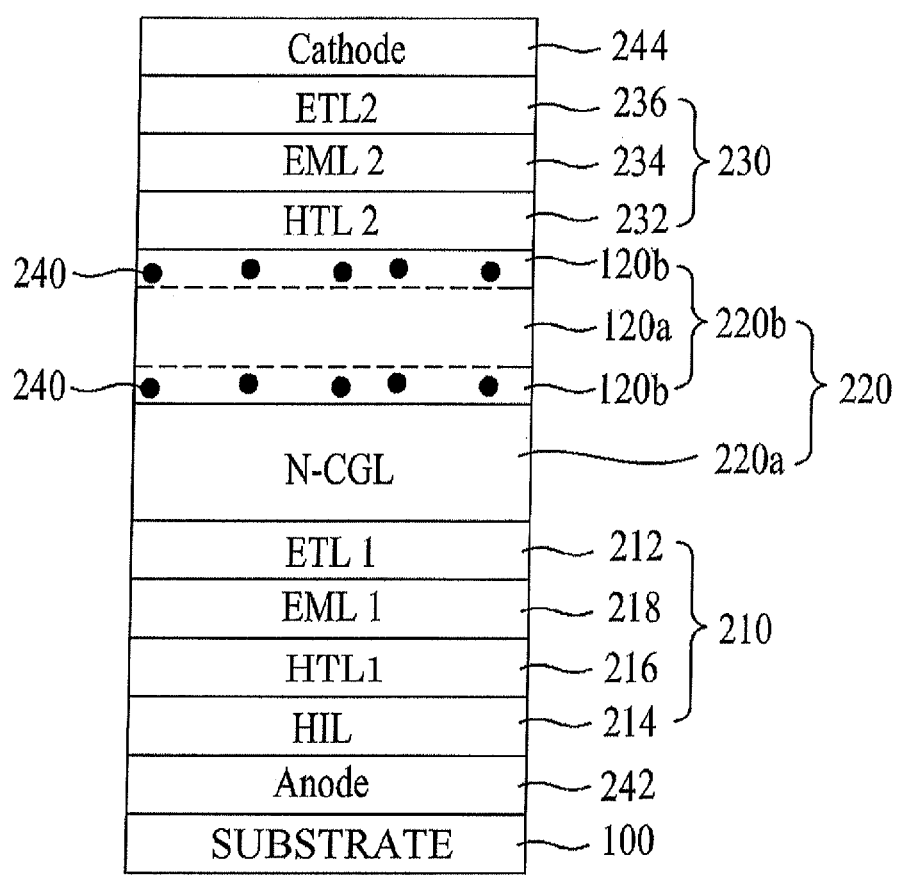
Figure 16D:
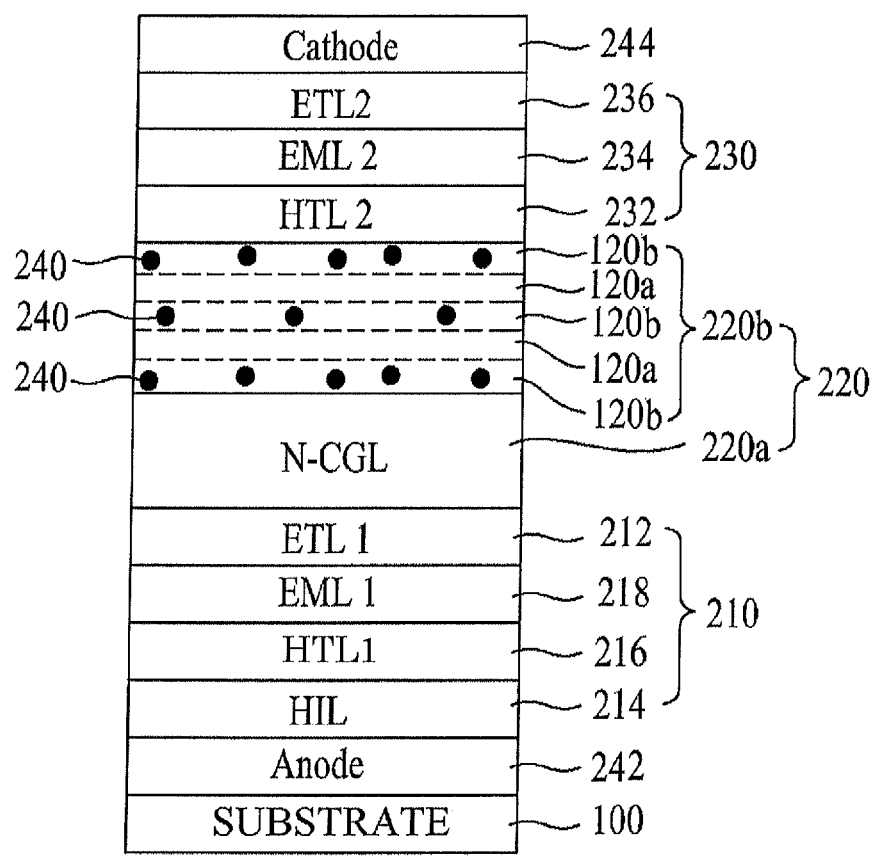

Referring to FIGS. 16A and 16B, the second P-type charge generation layer 120b has a double-layered structure such that two layers of the second P-type charge generation layer 120b are disposed alternately with two layers of the first P-type charge generation layer 120a in the P-type charge generation layer 220b. Here, the thickness of one first P-type charge generation layer 120a disposed between the N-type charge generation layer 220a and the second P-type charge generation layer 120b closer to the N-type charge generation layer is greater than the other first P-type charge generation layer 120a disposed in the P-type charge generation layer 220b, as illustrated in FIG. 16A. Then, the thickness of one first P-type charge generation layer 120a disposed between the second hole transport layer 232 and the second P-type charge generation layer 120b disposed closer to the hole transport layer 232 may be greater than the thickness of the other first P-type charge generation layer 120a disposed in the P-type charge generation layer 220b as illustrated in FIG. 16B. In FIG. 16C, the second P-type charge generation layers 120b are disposed at both surfaces of the first P-type charge generation layer 120a. Three second P-type charge generation layers 120b are disposed alternately with the first P-type charge generation layer 120a in the P-type charge generation layer 220b in FIG. 16D. Meanwhile, at least one second P-type charge generation layer 120b among the plurality of second P-type charge generation layers 120b illustrated in FIGS. 16A to 16D may be doped with the same dopant as the other second P-type charge generation layers 120b or a different dopant including a different hole transport material. In addition, at least one second P-type charge generation layer 120b among the plurality of the second P-type charge generation layers 120b illustrated in FIGS. 16A to 16D may be doped at the same doping concentration as the other second P-type charge generation layers 120b.

Figure 17:
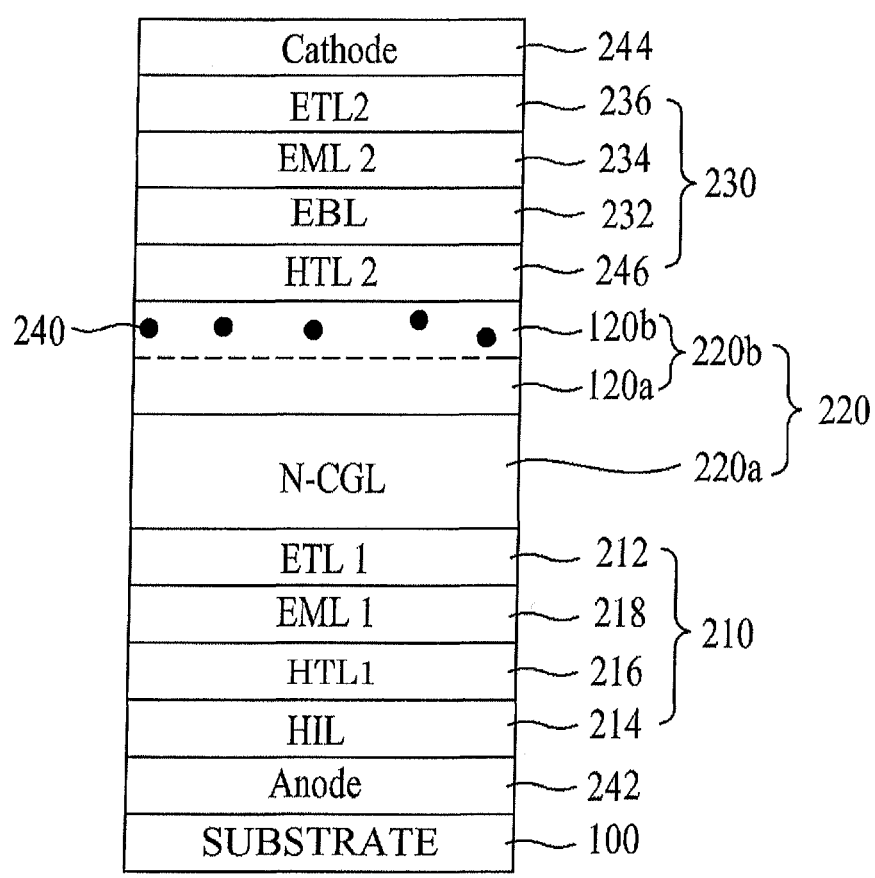
FIG. 17 is a cross-sectional view illustrating a white organic light emitting device according to a fourth embodiment of the present invention.

Meanwhile, as illustrated in FIG. 17, the white organic light emitting device according to the present invention may further include an electron blocking layer 246 disposed between the second hole transport layer 246 and the second light emitting layer 234. The electron blocking layer 246 is formed of a material having higher electron blocking capability than the hole blocking capability. Accordingly, the electron blocking layer 246 blocks electrons generated in the charge generation layer 220 from entering the second light emitting layer 234. The same effect may also be obtained by doping the P-type charge generation layer 120b with a material used to form the electron blocking layer 246 and the hole transport material without using the electron blocking layer 246.

As is apparent from the above description, the organic light emitting display device according to the present invention has a multi-stack structure including a first stack including a first light emitting layer, a charge generation layer including a P-type charge generation layer and an N-type charge generation layer, and a second stack including a second light emitting layer. In the P-type charge generation layer, 1 to 20% of a hole transport material is doped in the P-type charge generation layer based on the volume of the P-type charge generation layer. Thus, hole generation and hole injection are facilitated, and the organic light emitting display device may have decreased driving voltage and increased lifespan.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
a first electrode and a second electrode disposed on a substrate opposite to each other;
a first stack comprising a hole injection layer, a first hole transport layer, a first light emitting layer, and a first electron transport layer sequentially stacked on the first electrode;
a second stack comprising a second hole transport layer, a second light emitting layer, and a second electron transport layer sequentially stacked between the first stack and the second electrode; and
a charge generation layer disposed between the first stack and the second stack and comprising an N-type charge generation layer and at least one P-type charge generation layer to control charge balance between the first and second stacks,
wherein the at least one P-type charge generation layer is composed of HAT(CN)6 doped with 1% to 20% of a hole transport material based on a volume of the at least one P-type charge generation layer, wherein the hole transport material has a highest occupied molecular orbital (HOMO) level of 5.0 eV to 6.0 eV; and
wherein a thickness of a region in which the hole transport material is doped satisfies Expression 1 below to be at least 10% or greater of a total thickness of the at least one P-type charge generation layer:

$$L \times 0.1 \leq X \leq L, \quad \text{Expression 1}$$

where L is a thickness of the at least one P-type charge generation layer, and X is a thickness of the region in which the hole transport material is doped.

2. The organic light emitting display device according to claim 1, wherein the hole transport material doped in the at least one P-type charge generation layer has a mobility of $5.0 \times 10^{-5}$ cm$^2$/Vs to $1.0 \times 10^{-2}$ cm$^2$/Vs.

3. The organic light emitting display device according to claim 1, wherein the hole transport doped in the at least one P-type charge generation layer has a lowest unoccupied molecular orbital (LUMO) level of 2.0 eV to 3.5 eV.

4. The organic light emitting display device according to claim 1, wherein the hole transport material doped in the at least one P-type charge generation layer has a mobility of $9.0 \times 10^{-3}$ cm$^2$/Vs, a LUMO level of 2.1 eV, and a HOMO level of 5.2 eV.

5. The organic light emitting display device according to claim 1, wherein the hole transport material doped in the at least one P-type charge generation layer has a mobility of $6.0 \times 10^{-4}$ cm$^2$/Vs, a LUMO level of 2.3 eV, and a HOMO level of 5.5 eV.

6. The organic light emitting display device according to claim 1, wherein a thickness of a region in which the hole transport material is doped satisfies Expression 1 below to be a 10% or greater thickness of a total thickness of the at least one P-type charge generation layer has a mobility of $6.0 \times 10^{-4}$ cm$^2$/Vs, a LUMO level of 2.3 eV, and a HOMO level of 5.6 eV.

7. The original light emitting display device according to claim 1, further comprising a buffer layer between the at least one P-type charge generation layer doped with the hole transport layer and the N-type charge generation layer.

8. The organic light emitting display device according to claim 1, wherein the second hole transport layer of the second stack is formed by co-depositing the at least one P-type charge generation layer doped with the hole transport layer and the second hold transport layer of the second stack.

* * * * *